(12) United States Patent
Kotani et al.

(10) Patent No.: US 8,785,525 B2
(45) Date of Patent: Jul. 22, 2014

(54) THERMOSETTING LIGHT-REFLECTING RESIN COMPOSITION, OPTICAL SEMICONDUCTOR ELEMENT MOUNTING BOARD PRODUCED THEREWITH, METHOD FOR MANUFACTURE THEREOF, AND OPTICAL SEMICONDUCTOR DEVICE

(75) Inventors: Hayato Kotani, Tsukuba (JP); Naoyuki Urasaki, Chikusei (JP); Makoto Mizutani, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 321 days.

(21) Appl. No.: 12/679,749

(22) PCT Filed: Sep. 25, 2008

(86) PCT No.: PCT/JP2008/067250
§ 371 (c)(1),
(2), (4) Date: Mar. 24, 2010

(87) PCT Pub. No.: WO2009/041472
PCT Pub. Date: Apr. 2, 2009

(65) Prior Publication Data
US 2010/0200882 A1    Aug. 12, 2010

(30) Foreign Application Priority Data

Sep. 25, 2007 (JP) ................. P2007-247027
Nov. 13, 2007 (JP) ................. P2007-294224
Nov. 26, 2007 (JP) ................. P2007-304255

(51) Int. Cl.
C08K 7/24    (2006.01)
C08K 3/22    (2006.01)
C08L 63/00   (2006.01)

(52) U.S. Cl.
USPC .......................................... 523/458; 523/457

(58) Field of Classification Search
None
See application file for complete search history.

(56) References Cited

U.S. PATENT DOCUMENTS

| 5,284,938 A * | 2/1994 | Dangayach et al. ......... 523/457 |
| 2007/0030667 A1 | 2/2007 | Watanabe et al. |
| 2010/0140638 A1 * | 6/2010 | Kotani et al. ................. 257/98 |

FOREIGN PATENT DOCUMENTS

| JP | 63-165428 | | 7/1988 |
| JP | 63-165428 A | * | 7/1988 |
| JP | 4-76020 A | * | 3/1992 |
| JP | 04-216855 | | 8/1992 |
| JP | 7-68186 A | * | 10/1995 |
| JP | 07-268186 | | 10/1995 |
| JP | 2000-281750 | | 10/2000 |
| JP | 2002-302533 | | 10/2002 |
| JP | 2003-321532 | | 11/2003 |
| JP | 3618133 | | 11/2004 |
| JP | 2005-146191 | | 6/2005 |
| JP | 2006-140207 | | 6/2006 |
| JP | 2006-140207 A | * | 6/2006 |
| JP | 2006-193566 A | * | 7/2006 |
| JP | 2006-274221 A | * | 10/2006 |
| JP | 2007-129173 | | 5/2007 |
| JP | 2009-097005 | | 5/2009 |
| JP | 2009-141327 | | 6/2009 |
| JP | 2009-149845 | | 7/2009 |
| WO | WO 2007/015426 | | 2/2007 |
| WO | WO 2007/142018 | | 12/2007 |
| WO | WO 2008/059856 A1 | * | 5/2008 |

OTHER PUBLICATIONS

Extended European Search Report dated Mar. 11, 2013, for EP Application No. 12186532.3-1301/2540775.
Extended European Search Report dated Mar. 11, 2013, for EP Application No. 12186535.6-1301/2540776.
Japanese Official Action dated Dec. 4, 2012, for JP Application No. 2008-246251.
Japanese Official Action issued on Jun. 4, 2013, for JP Application No. 2008-246255.
Chinese Official Action issued on Aug. 13, 2013, for CN Application No. 2012102809172.

* cited by examiner

Primary Examiner — Robert Sellers
(74) Attorney, Agent, or Firm — Antonelli, Terry, Stout & Kraus, LLP.

(57) ABSTRACT

There is provided a thermosetting light-reflecting resin composition that has a high level of various characteristics required of optical semiconductor element mounting boards, such as optical properties and thermal discoloration resistance, provides high releasability during molding such as transfer molding, and allows molding processes to be performed continuously. There are also provided a highly-reliable optical semiconductor element mounting board and an optical semiconductor device each produced with the resin composition, and methods for efficient production thereof. A thermosetting light-reflecting resin composition is prepared and used, which includes (A) an epoxy resin, (B) a curing agent, (C) a curing catalyst, (D) an inorganic filler, (E) a white pigment, (F) an additive, and (G) a release agent as major components, wherein the resin composition, after curing, has a diffuse reflectance of 80% or more at a light wavelength of 400 nm; and the resin composition is possible to perform transfer molding 100 times or more continuously.

24 Claims, 5 Drawing Sheets

(a)

(b)

(a)

(b)

(a)

(b)

(a)

(b)

THERMOSETTING LIGHT-REFLECTING RESIN COMPOSITION, OPTICAL SEMICONDUCTOR ELEMENT MOUNTING BOARD PRODUCED THEREWITH, METHOD FOR MANUFACTURE THEREOF, AND OPTICAL SEMICONDUCTOR DEVICE

TECHNICAL FIELD

The invention relates to a thermosetting light-reflecting resin composition for use in an optical semiconductor device including a combination of an optical semiconductor element and wavelength conversion means such as a fluorescent substance, an optical semiconductor element mounting board produced therewith, a method for manufacture thereof, and an optical semiconductor device.

BACKGROUND ART

In recent years, optical semiconductor devices including a combination of an optical semiconductor element such as an LED (Light Emitting Diode) and a fluorescent substance have grown in demand and found various applications including an outdoor display, a portable liquid crystal backlight, and automotive applications, because of their advantages such as high energy efficiency and long life. As LED devices have had increased brightness accordingly, the junction temperature has been increased because of increase in the quantity of heat emitted from the elements, or optical energy itself has been increased, which causes the problem of degradation of device materials. In recent years, therefore, development of device materials resistant to thermal degradation and photo-degradation has been awaited.

Japanese Patent Application Laid-Open (JP-A) No. 2006-140207 discloses an optical semiconductor element mounting board having good light reflection characteristics even after a heat test. Typically, as in the disclosure, a conventional thermosetting light-reflecting resin composition used as a board material often contains a release agent that has been added into the resin composition so that the board can be released smoothly from the mold in the process of manufacturing the board. In many cases, however, most compounds used as release agents are not compatible with based resin including epoxy resin, a curing agent and so on, which form a thermosetting light-reflecting resin composition. Therefore, when a board is formed by molding a resin composition containing such a release agent, the board is more likely to have poor appearance due to insufficient dispersion of the release agent, and this tends to make continuous molding difficult. Particularly, when an LED package is produced, a mold shaped to have a recessed part corresponding to an optical semiconductor element mounting region is used, and therefore, the flow behavior of the resin charged into the mold may vary greatly depending on the position. The flow behavior as well as insufficient dispersion of the release agent gives rise to destruction of the package or the poor appearance of the package.

A release agent and a dispersing agent optionally used together with the release agent are often thermally-unstable organic compounds. For example, therefore, when used for a long time under high temperature conditions or when exposed to high-temperature heating or used for optical semiconductor devices, a resin composition containing such compounds tends to be colored or have a reduced diffuse reflectance, so that it may tend to be difficult to obtain sufficient optical properties or reliability. Therefore, there has been a demand for development of a thermosetting light-reflecting resin composition having a high level of various molding characteristics such as releasability and also having good optical properties as well as high thermal discoloration resistance.

Patent Document 1: JP-A No. 2006-140207

DISCLOSURE OF THE INVENTION

The invention has been made in view of the above and is directed to a thermosetting light-reflecting resin composition that has a high level of various characteristics required of optical semiconductor element mounting boards, such as optical properties and thermal discoloration resistance, provides high releasability during molding, and allows transfer molding processes to be performed continuously. The invention is also directed to a highly-reliable optical semiconductor element mounting board and an optical semiconductor device each produced with such a resin composition, and methods for efficient production thereof.

The inventors have made investigations on a thermosetting light-reflecting resin composition that can not only have good optical properties and thermal discoloration resistance but also provide good releasability so that optical semiconductor element mounting boards can be continuously formed by molding in a satisfactory manner. As a result, the inventors have made the invention, based on the finding that a shear release force during transfer molding and the surface free energy of the release surface can each be used as an index of releasability and that a specific compound is effective in improving the releasability.

Specifically, the invention has the features described below.

(1) A thermosetting light-reflecting resin composition, including (A) an epoxy resin, (B) a curing agent, (C) a curing catalyst, (D) an inorganic filler, (E) a white pigment, (F) an additive, and (G) a release agent, wherein the resin composition, after curing, has a diffuse reflectance of 80% or more at a light wavelength of 400 nm; and the resin composition is possible to perform transfer molding 100 times or more continuously.

(2) The thermosetting light-reflecting resin composition of item (1), wherein the resin composition provides a shear release force of 200 KPa or less within 10 shots of the transfer molding.

(3) The thermosetting light-reflecting resin composition of item (1), wherein the resin composition provides a shear release force of 200 KPa or less at the first shot of the transfer molding.

(4) The thermosetting light-reflecting resin composition of item (1), wherein a surface free energy at a surface of a product obtained after releasing from a mold is at most 30 mJ/m2, when the product is formed by performing transfer molding of the resin composition and then releasing from the mold.

(5) The thermosetting light-reflecting resin composition of item (4), wherein after releasing from the mold, a surface free energy at a surface of the mold is at most 30 mJ/m2.

(6) The thermosetting light-reflecting resin composition of item (1), wherein a curing product of the resin composition has a diffuse reflectance of 80% or more at a light wavelength of 400 nm, when it is measured after the curing product is allowed to stand under a high temperature condition at 150° C. for 500 hours.

(7) The thermosetting light-reflecting resin composition of any one of items (1) to (6), wherein the additive (F) includes a compound including structural units represented by formula (I) below:

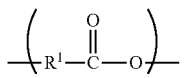

wherein $R^1$ is selected from the group consisting of an alkylene group having 1 to 10 carbon atoms, and formula (II) below:

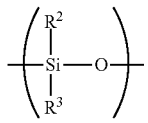

wherein $R^2$ and $R^3$ are independently selected from the group consisting of: a monovalent organic group having 1 to 10 carbon atoms including at least one of an alkyl group, an aryl group, an alkoxy group, and an epoxy group; a monovalent organic group having 1 to 10 carbon atoms including a carboxyl group; and a polyalkylene ether group having 3 to 500 carbon atoms.

(8) The thermosetting light-reflecting resin composition of item (7), wherein the compound has a number average molecular weight Mn of 2,000 to 20,000.

(9) The thermosetting light-reflecting resin composition of item (7) or (8), wherein the compound has a dispersity (Mw/Mn) of 1 to 3.

(10) The thermosetting light-reflecting resin composition of any one of items (7) to (9), wherein the compound has a weight ratio (I)/(II), of the structural unit represented by formula (I) to the structural unit represented by the formula (II), of 3/7 to 7/3.

(11) The thermosetting light-reflecting resin composition of item (7), wherein the compound used as the additive (F) has a content of 1 to 50 parts by weight, based on 100 parts by weight of the epoxy resin (A).

(12) The thermosetting light-reflecting resin composition of any one of items (7) to (11), wherein the compound is a triblock copolymer represented by the formula (I)-(II)-(I).

(13) The thermosetting light-reflecting resin composition of item (12), wherein the triblock copolymer is a compound represented by the following formula (III):

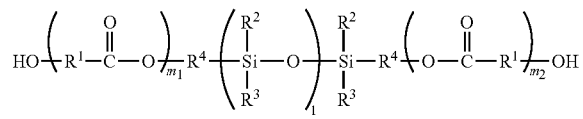

wherein
l is an integer of 1 to 200,
$m_1+m_2$ is an integer of 2 to 400,
$R^1$ is selected from the group consisting of an alkylene group having 1 to 10 carbon atoms,
$R^2$ and $R^3$ are independently selected from the group consisting of: a monovalent organic group having 1 to 10 carbon atoms including at least one of an alkyl group, an aryl group, an alkoxy group, and an epoxy group; a monovalent organic group having 1 to 10 carbon atoms including a carboxyl group; and a polyalkylene ether group having 3 to 500 carbon atoms, and $R^4$ is selected from the group consisting of a divalent hydrocarbon group having 1 to 10 carbon atoms.

(14) The thermosetting light-reflecting resin composition of any one of items (1) to (13), wherein the release agent (G) includes a metallic soap having a structure represented by formula (1-1) below:

$$(R_0\text{—COO})qM_1 \qquad (1\text{-}1)$$

wherein $R_0$ is a substituent selected from the group consisting of: a monovalent organic group having 3 to 50 carbon atoms including at least one of an alkyl group, an aryl group, an alkoxy group, and an epoxy group; a monovalent organic group having 3 to 50 carbon atoms including a carboxyl group; and a polyalkylene ether group having 3 to 500 carbon atoms, $M_1$ is a metal element selected from the group consisting of: third period elements; Group IIA alkaline earth metal elements; and metal elements belonging to Groups IVB, IIB, VIII, IB, IIIA, IIIB, and IVA, and q is an integer of 1 to 4.

(15) The thermosetting light-reflecting resin composition of item (14), wherein in formula (1-1), $M_1$ is a metal element selected from the group consisting of magnesium, calcium, barium, aluminum, tin, titanium, iron, cobalt, nickel, copper, and zinc.

(16) The thermosetting light-reflecting resin composition of item (14) or (15), wherein in formula (1-1), $R_0$ is selected from the group consisting of an alkyl group having 10 to 50 carbon atoms.

(17) The thermosetting light-reflecting resin composition of item (14), wherein the metallic soap is zinc stearate or aluminum stearate.

(18) The thermosetting light-reflecting resin composition of any one of items (1) to (17), wherein at least one of the release agent (G) and the additive (F) is premixed with part or all of the epoxy resin (A).

(19) The thermosetting light-reflecting resin composition of any one of items (1) to (18), wherein the inorganic filler (D) is at least one selected from the group consisting of silica, aluminum hydroxide, magnesium hydroxide, barium sulfate, magnesium carbonate, and barium carbonate.

(20) The thermosetting light-reflecting resin composition of any one of items (1) to (19), wherein the white pigment (E) is at least one selected from the group consisting of alumina, magnesium oxide, antimony oxide, titanium oxide, zirconium oxide, and inorganic hollow particles.

(21) The thermosetting light-reflecting resin composition of any one of items (1) to (20), wherein the white pigment (E) has a center particle size of 0.1 to 50 μm.

(22) The thermosetting light-reflecting resin composition of any one of items (1) to (21), wherein a total content of the inorganic filler (D) and the white pigment (E) is 10% by volume to 85% by volume, based on the total amount of the resin composition.

(23) An optical semiconductor element mounting board, including at least one recessed portion that forms an optical semiconductor element mounting region, wherein at least an inner circumference side of the recessed portion is made from the thermosetting light-reflecting resin composition of any one of items (1) to (22).

(24) A method for manufacturing an optical semiconductor element mounting board having at least one recessed portion that forms an optical semiconductor element mounting region, including molding the thermosetting light-reflecting resin composition of any one of items (1) to (22) to form at least an inner circumference side of the recessed portion.

(25) An optical semiconductor device, including: the optical semiconductor element mounting board of item (23); an optical semiconductor element mounted on the bottom of the recessed portion of the board; and a fluorescent substance-containing transparent encapsulant resin layer that is formed in the recessed portion so that the optical semiconductor element is covered with it.

According to the invention, there is provided a thermosetting light-reflecting resin composition having good optical properties and high releasability. Using such a resin composition makes it possible to form optical semiconductor mounting boards by continuous molding processes in a satisfactory manner. According to the invention, therefore, the frequency with which an external release agent is used during transfer molding is reduced, so that the productivity is increased. The resin composition of the invention also has good light reflection characteristics in the near-ultraviolet region and has high thermal discoloration resistance. Therefore, the resin composition of the invention allows efficient reflection of light from a light-emitting element and allows the production of optical semiconductor mounting boards that can maintain high reliability for a long term.

This application claims the priority of Japanese Patent Application No. 2007-247027 filed on Sep. 25, 2007, Japanese Patent Application No. 2007-294224 filed on Nov. 13, 2007, and Japanese Patent Application No. 2007-304255 filed on Nov. 26, 2007, the entirety of which is incorporated by reference herein.

DESCRIPTION OF REFERENCE NUMERALS

Figure 1:
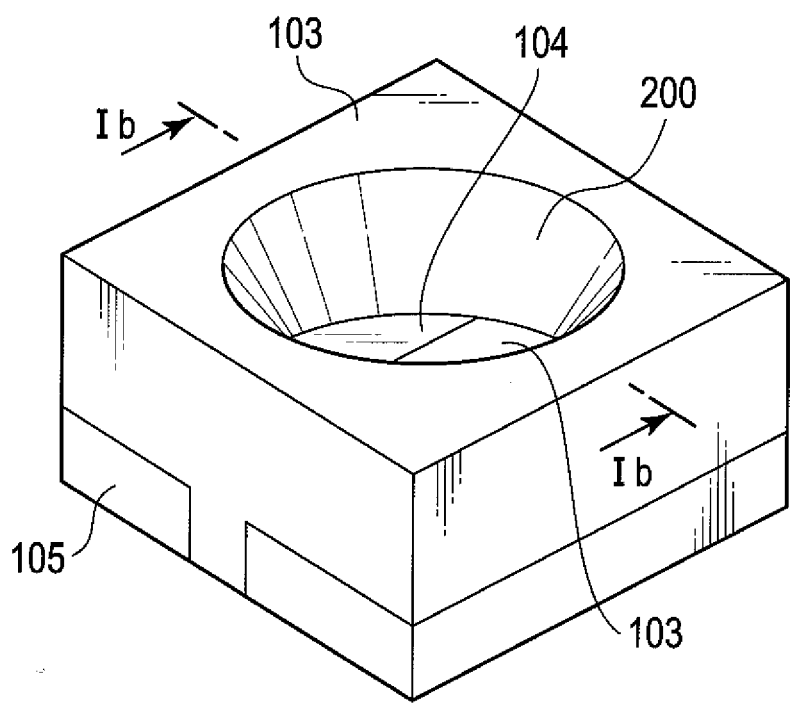
FIG. 1 is a diagram showing an example of the optical semiconductor mounting board of the invention, in which part (a) is a perspective view, and part (b) is a cross-sectional view along the line Ib-Ib.
Figure 1:
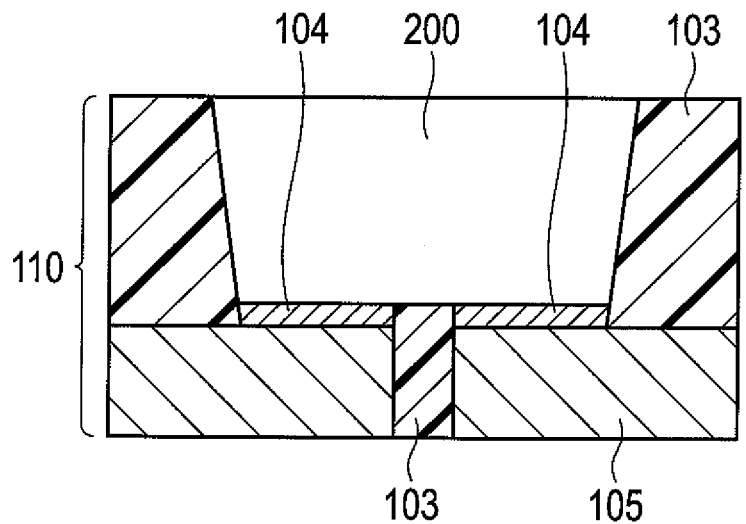

In the drawings, each reference numeral is as follows: 100 an optical semiconductor element, 101 a transparent encapsulant resin, 102 a bonding wire, 103 a thermally-cured reflecting resin (reflector), 104 a Ni/Ag plating, 105 a metal wiring, 106 a fluorescent substance, 107 a solder bump, 110 an optical semiconductor element mounting board, 200 an optical semiconductor element mounting region, 300 an LED element, 301 a wire bond, 302 a transparent encapsulant resin, 303 a reflector, 304 a lead, 305 a fluorescent substance, 306 a die bond material, 307 a metal substrate, 400 a shear release force measuring mold, 410 an upper mold part, 412 a resin inlet, 414 a cavity, 416 a lower mold part, 420 a stainless steel plate, 420a the release surface of the stainless plate (to be measured), 430 a molded product, and 430a the release surface of the molded product (to be measured).

BEST MODE FOR CARRYING OUT THE INVENTION

Embodiments of the invention are described below. The thermosetting light-reflecting resin composition of the invention includes (A) an epoxy resin, (B) a curing agent, (C) a curing catalyst, (D) an inorganic filler, (E) a white pigment, (F) an additive, and (G) a release agent as major components, wherein the resin composition, after curing, has a diffuse reflectance of 80% or more at a light wavelength of 400 nm, and it is possible to perform transfer molding 100 times or more continuously. In an embodiment of the invention, the resin composition preferably provides a shear release force of 200 KPa or less within 10 shots of transfer molding. In another embodiment of the invention, it is preferred that a surface free energy at a surface of a product obtained after releasing from a mold is at most 30 mJ/m2, when the product is formed by performing transfer molding of the resin composition and then releasing from the mold. In another embodiment of the invention, it is preferred that a curing product of the resin composition has a diffuse reflectance of 80% or more at a light wavelength of 400 nm, when it is measured after the curing product is allowed to stand under a high temperature condition at 150° C. for at least 72 hours. The resin composition according to each of the above embodiments of the invention is achieved by appropriately selecting the compound for use as the release agent (G) and a compound capable of functioning as a dispersing agent to emulsify and disperse the above compound or functioning as a release aid. Each component of the thermosetting resin composition for light refection is described below.

In an embodiment of the invention, any epoxy resin that has generally been used as a molding material may be used as the epoxy resin (A). Examples include epoxidation products of novolac resins derived from phenols and aldehydes, such as phenol novolac epoxy resins and ortho-cresol novolac epoxy resins; diglycidyl ethers of bisphenol A, bisphenol F, bisphenol S, alkyl-substituted bisphenol, or the like; glycidylamine epoxy resins obtained by the reaction of a polyamine such as diaminodiphenylmethane and isocyanuric acid with epichlorohydrin; linear aliphatic epoxy resins obtained by oxidation of olefin bonds with a peracid such as peracetic acid; and alicyclic epoxy resins. Any two or more of these resins may be used in combination.

The epoxy resin used in an embodiment of the invention is preferably colorless or relatively colorless (such as light yellow). Examples of such resins include bisphenol A epoxy resins, bisphenol F epoxy resins, bisphenol S epoxy resins, diglycidyl isocyanurate, and triglycidyl isocyanurate.

In an embodiment of the invention, any curing compound capable of reacting with the epoxy resin may be used as the curing agent (B), while it preferably has a molecular weight of about 100 to about 400. The curing agent is preferably colorless or relatively colorless (such as light yellow). Examples of such a curing agent include an acid anhydride curing agent, an isocyanuric acid derivative, and a phenolic curing agent.

Examples of the acid anhydride curing agent include phthalic anhydride, maleic anhydride, trimellitic anhydride, pyromellitic dianhydride, hexahydrophthalic anhydride, tetrahydrophthalic anhydride, methyl nadic anhydride, nadic anhydride, glutaric anhydride, dimethylglutaric anhydride, diethylglutaric anhydride, succinic anhydride, methylhexahydrophthalic anhydride, and methyltetrahydrophthalic anhydride or the like. These compounds may be used alone or in combination of two or more thereof.

Examples of the isocyanuric acid derivative include 1,3,5-tris(1-carboxymethyl)isocyanurate, 1,3,5-tris(2-carboxyethyl)isocyanurate, 1,3,5-tris(3-carboxypropyl)isocyanurate, and 1,3-bis(2-carboxyethyl)isocyanurate. These may be used alone or in combination of two or more thereof.

Examples of the Phenolic Curing Agent Include:

novolac-type phenolic resins obtained by condensing or co-condensing, in the presence of an acid catalyst, the following compounds (1) and (2) and/or (3): (1) an aldehyde group-containing compound such as formaldehyde, benzaldehyde, and salicyl aldehyde, (2) a phenol such as phenol, cresol, resorcin, catechol, bisphenol A, bisphenol F, phenylphenol, and aminophenol, (3) a naphthol such as α-naphthol, β-naphthol and dihydroxynaphthalene;

phenol-aralkyl resins synthesized from a phenol and/or a naphthol and dimethoxy-p-xylene or bis(methoxymethyl)biphenyl;

aralkyl-type phenolic resins such as biphenylene-type phenol-aralkyl resins and naphthol-aralkyl resins;

dicyclopentadiene-type phenolic resins synthesized by copolymerization of a phenol and/or a naphthol and dicyclopentadiene, such as dicyclopentadiene-type phenol novolac resins and dicyclopentadiene-type naphthol novolac resins;

triphenylmethane-type phenolic resins; terpene-modified phenolic resins;

p-xylylene- and/or m-xylylene-modified phenolic resins;

melamine-modified phenolic resins;

cyclopentadiene-modified phenolic resins; and phenolic resins obtained by copolymerizing two or more thereof.

Among the curing agents listed above, phthalic anhydride, trimellitic anhydride, hexahydrophthalic anhydride, tetrahydrophthalic anhydride, methylhexahydrophthalic anhydride, methyltetrahydrophthalic anhydride, glutaric anhydride, dimethylglutaric anhydride, diethylglutaric anhydride, or 1,3,5-tris(3-carboxypropyl)isocyanurate is preferably used.

In the thermosetting light-reflecting resin composition of the invention, the mixing ratio of the epoxy resin (A) and the curing agent (B) is preferably such that one equivalent of the epoxy group of the epoxy resin (A) is mixed with 0.5 to 1.2 equivalents, more preferably 0.6 to 1.0 equivalent of the active group (such as an acid anhydride group or a hydroxyl group) of the curing agent (B), in which the active group is reactive with the epoxy group. If the amount of the active group is less than 0.5 equivalents, the epoxy resin composition may have a low curing rate and may form a cured product with low glass transition temperature so that sufficient elastic modulus cannot be obtained in some cases. If the amount of the active group is more than 1.2 equivalents, the strength of the cured product may be low in some cases.

In an embodiment of the invention, any appropriate known compound may be used as the curing catalyst (curing accelerator) (C), and it is not specifically limited. Examples include tertiary amines such as 1,8-diaza-bicyclo(5,4,0)undecene-7, triethylenediamine, and tri-2,4,6-dimethylaminomethylphenol; imidazoles such as 2-ethyl-4-methylimidazole and 2-methylimidazole; phosphorous compounds such as triphenylphosphine, tetraphenylphosphonium tetraphenylborate, tetra-n-butylphosphonium-o,o-diethylphosphorodithioate, tetra-n-butylphosphonium-tetrafluoroborate, and tetra-n-butylphosphonium-tetraphenylborate; quaternary ammonium salts; and organometallic salts and derivatives thereof. These may be used alone or in combination of two or more thereof. Among these curing catalysts, tertiary amines, imidazoles or phosphorous compounds are preferably used.

The content of the curing catalyst (C) is preferably from 0.01 to 8.0% by weight, more preferably from 0.1 to 3.0% by weight, based on the amount of the epoxy resin (A). If the content of the curing catalyst is less than 0.01% by weight, the curing accelerating effect cannot be sufficiently obtained in some cases. If the content of the curing catalyst is more than 8.0% by weight, discoloration may be observed in the molded product in some cases.

The inorganic filler (D) for use in an embodiment of the invention is not specifically limited. For example, the inorganic filler (D) to be used may be at least one selected from the group consisting of silica, aluminum hydroxide, magnesium hydroxide, barium sulfate, magnesium carbonate, and barium carbonate. In view of the formability of the resin composition and fire retardancy, at least two of silica, aluminum hydroxide, and magnesium hydroxide are preferably used in combination. In view of the efficiency of packing with the white pigment (E), the center particle size of the compound used as the inorganic filler (D) is preferably, but not limited to, from 1 to 100 μm.

In an embodiment of the invention, any appropriate known compound may be used as the white pigment (E), and it is not specifically limited. Examples include alumina, magnesium oxide, antimony oxide, titanium oxide, zirconium oxide, inorganic hollow particles, and so on. These may be used alone or in combination of two or more thereof. In view of thermal conductivity and light reflection characteristics, alumina is preferably used.

Examples of inorganic hollow particles include hollow particles of silicate soda glass, aluminum silicate glass, borosilicate soda glass, or the like. The center particle size of the white pigment is preferably in the range of 0.1 to 50 μm. If the center particle size is less than 0.1 μm, the particles may be more likely to aggregate and its dispersibility tends to be low. If the center particle size is more than 50 μm, the light reflection characteristics of the resulting cured product may be insufficient.

In the thermosetting light-reflecting resin composition of the invention, the total amount of the inorganic filler (D) and the white pigment (E) is preferably, but not limited to, from 10 to 85% by volume, based on the total amount of the resin composition. If the total amount is less than 10% by volume, the light reflection characteristics of the resulting cured product may be insufficient. If it is more than 85% by volume, the resin composition may have low formability, so that a board may be difficult to produce with the resin composition.

The additive (F) used in an embodiment of the invention may include at least a compound capable of functioning as a dispersing agent to emulsify and disperse the release agent (G) or as a release aid. An organosiloxane moiety-containing compound including structural units represented by formulae (I) and (II) below, respectively, is preferred, because it assists emulsification and dispersion of the release agent and functions as a release aid by itself.

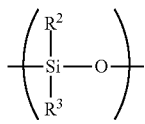

In formula (I), $R^1$ may be selected from the group consisting of an alkylene group having 1 to 10 carbon atoms; and is preferably, but not limited to, a propylene group in view of the dispersibility of the silicone domain. In formula (II), $R^2$ and $R^3$ are independently selected from the group consisting of: a monovalent organic group having 1 to 10 carbon atoms including at least one of an alkyl group, an aryl group, an alkoxy group, and an epoxy group; a monovalent organic group having 1 to 10 carbon atoms including a carboxyl group; and a polyalkylene ether group having 3 to 500 carbon atoms; and $R^2$ and $R^3$ may be the same or different. In view of the dispersibility of the silicone domain, at least one of $R^2$ and $R^3$ is preferably, but not limited to, an alkyl group or an aryl group, particularly a methyl group. When at least one of $R^2$ and $R^3$ is a polyalkylene ether group, the compound used as the additive (F) preferably includes a structural unit represented by formula (IV) below.

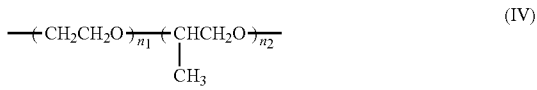

In the formula, $n_1$ and $n_2$ are each preferably an integer of 20 or less, and at least one of them may be 0.

As used herein, the term "the dispersibility of the silicone domain" means the distance between siloxane components of a microphase-separated structure, the arrangement of the siloxane components, and the degree of distribution of the siloxane components, wherein the microphase-separated structure is formed between the organosiloxane moiety-containing compound used as the additive (F) and a base resin composed of the epoxy resin (A) and the curing agent (B). The term "microphase-separated structure" refers to a state where micrometer to sub-nanometer scale island components (domains) are phase-separated into sea-island structures. In an embodiment of the invention, the silicone domain of the compound has good dispersibility in the base resin, so that it can improve the dispersibility of the release agent. In an embodiment of the invention, therefore, it is important to more finely disperse the silicone domain parts into the resin component, namely, to increase the dispersibility of the silicone domain.

On the other hand, the term "the dispersibility of the release agent" means how much the release agent (G) can be emulsified and dispersed with the additive (F) into the base resin composed of the epoxy resin (A) and the curing agent (B). Therefore, "the dispersibility of the silicone domain" and "the dispersibility of the release agent" should be independently taken into account. Concerning each of "the dispersibility of the silicone domain" and "the dispersibility of the release agent," the specific degree of dispersion may be observed using a scanning electron microscope, a transmission electron microscope, or the like. The degree of dispersion may also be quantified as a numerical value by a well-known method such as a light-scattering method.

In the compound used as the additive (F), the weight ratio (I)/(II) of the structural unit represented by formula (I) to that represented by formula (II) is preferably from 3/7 to 7/3, more preferably from 4/6 to 6/4, most preferably 5/5. If the structural unit of formula (I) is present in excess of the range, the fluidity may tend to be significantly reduced. If the structural unit of formula (II) is present in excess, the adhesive properties may tend to be reduced. When the compound has a number average molecular weight Mn of about 6,000 and includes the structural units of formulae (I) and (II) in the same weight ratio, it is generally a white solid. However, the compound containing the structural unit of formula (I) more than that of formula (II) is generally liquid, even when it has a Mn of about 6,000. The characteristics of the compound vary with the weight ratio between the respective structural units as shown above. Therefore, it is preferred that the compound should be selected so as to have an appropriate weight ratio, taking into account a balance of the properties such as dispersibility, fluidity, adhesion to the adherend, and elastic modulus. The weight ratio between the structural units of formula (I) and (II) in the compound may be determined by a process including measuring the $^1$H-NMR spectrum and calculating the weight ratio from the integrated values of protons of the respective structural units.

In an embodiment of the invention, the compound used as the additive (F) preferably has a number average molecular weight (Mn) of 2,000 or less in view of adhesion to the adherend such as metal, and preferably 20,000 or less in view of preventing a reduction in fluidity. In order to appropriately control the elastic modulus of the resin composition, the Mn is preferably from 2,000 to 20,000, more preferably from 3,000 to 15,000, particularly preferably from 5,000 to 10,000.

As used herein, the term "number average molecular weight (Mn)" refers to a value determined by gel permeation chromatography (GPC) method using standard polystyrene calibration curve. More specifically, the Mn described herein is a value measured by GPC using a pump (Model L-6200, manufactured by Hitachi, Ltd.), columns (TSKgel-G5000HXL and TSKgel-G2000HXL (trade names), all manufactured by TOSOH CORPORATION), a detector (Model L-3300RI, manufactured by Hitachi, Ltd.), and tetrahydrofuran as an eluent under the conditions of a temperature of 30° C. and a flow rate of 1.0 ml/minute.

In an embodiment of the invention, the compound used as the additive (F) is preferably a triblock copolymer having the structural unit of formula (II) interposed between the structural units of formula (I), which are present at both ends of the structural unit of formula (II). Specifically, it is preferably a triblock copolymer having a formula (I)-(II)-(I) structure in which the respective structural units are liked through a linking group. In particular, a compound represented by formula (III) below, which corresponds to such a triblock polymer, is preferably used as the additive (F) in an embodiment of the invention.

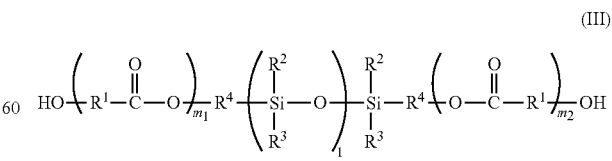

In formula (III), l is an integer of 1 to 200, $m_1+m_2$ is an integer of 2 to 400, $R^1$ is selected from the group consisting of an alkylene group having 1 to 10 carbon atoms, $R^2$ and $R^3$ are each independently selected from the group consisting of: a monovalent organic group having 1 to 10 carbon atoms including at least one of an alkyl group, an aryl group, an alkoxy group, and an epoxy group; a monovalent organic group having 1 to 10 carbon atoms including a carboxyl group; and a polyalkylene ether group having 3 to 500 carbon atoms, and $R^4$ is selected from the group consisting of a divalent hydrocarbon group having 1 to 10 carbon atoms. In view of dispersibility in the resin composition, the number of the carbon atoms does not have to be the same between $R^1$ to $R^4$ in the compound represented by formula (III), and there is preferably a distribution of carbon atom numbers of $R^1$ to $R^4$ within the above range.

As described above, improving the dispersibility of the silicone domain is important to effectively increase the dispersibility of the release agent by means of the above compound. For this purpose, the dispersity of the compound, namely, weight average molecular weight (Mw)/number average molecular weight (Mn) is preferably from 1 to 3. The dispersity of the compound is more preferably from 1 to 2.5, even more preferably from 1 to 2. In this regard, Mw and Mn are each a value measured by GPC method using a standard polystyrene calibration curve. The dispersity is a parameter indicating the degree of the molecular weight distribution of a polymer compound. As dispersity value closer to 1, it means that the molecular weight distribution is narrower. In an embodiment of the invention, a compound having a dispersity close to 1 may be used, so that the compound can be prevented from being unevenly distributed and can be evenly distributed in the resin components such as the epoxy resin and the curing agent. As a result, a microphase-separated structure can be obtained, which contains silicone domain parts finely dispersed in resin components. However, the compound may have a tendency to be more likely to aggregate as the Mn of the compound increases, even when the compound used have a dispersity close to 1. Therefore, it is preferred that the compound should have a dispersity in the above range, while it should have an appropriate Mn as described above. Specifically, the Mn of the compound is preferably in the range of 2,000 to 20,000 in view of adhesive properties, fluidity, elastic modulus, and so on.

In an embodiment of the invention, for example, the above compound may be a compound obtained by ring-opening condensation between a polysiloxane compound and a caprolactone compound, wherein the polysiloxane compound has both ends or a side chain modified with a hydroxyl group. The esterification for the preparation of such a compound may be performed using a known method. The compound obtained by the esterification between the polysiloxane compound having both ends modified with hydroxyl groups and the caprolactone compound is preferably used as the additive in an embodiment of the invention, because it tends to have a dispersity close to 1, when each compound used as a raw material has no molecular weight distribution.

Such a compound may be obtained as a commercial product. For example, SLM446200 (trade name) series manufactured by Wacker Chemie AG, which correspond to compounds having structural units derived from caprolactone and polydimethylsiloxane, are preferably used in an embodiment of the invention. Product No. SLJ1661 and a series of Product Nos. SLJ1731 to 1734 developed by WACKER ASAHIKASEI SILICONE CO., LTD. are also preferred.

In an embodiment of the invention, the thermosetting light-reflecting resin composition preferably includes 1 to 50 parts by weight, more preferably 2 to 30 parts by weight, particularly preferably 5 to 20 parts by weight of the above-mentioned compound used as the additive (F), based on 100 parts by weight of the epoxy resin (A). If the amount of the compound is less than 1 part by weight, it may be less effective in dispersing the silicone domain and the release agent. If the amount of the compound is more than 50 parts by weight, the fluidity and the fire retardancy of the resin composition may tend to be low.

The release agent (G) used in an embodiment of the invention may be of any type capable of appropriately controlling the shear release force and the surface free energy during transfer molding. Preferably, the release agent (G) used in an embodiment of the invention should be selected taking into account an affinity for the compound described above as a preferred example of the dispersing agent (F). The release agent (G) used in an embodiment of the invention is preferably a compound that does not act as a catalyst for an unexpected side reaction in the process involving a chemical reaction such as a heat-curing reaction of the resin composition or a B-staging process (oligomerization or polymerization) during kneading.

In an embodiment of the invention, a compound having a structure represented by formula (1-1) below and generally called metallic soap is preferably used as the release agent (G).

$$(R_0\text{—COO})qM_1 \qquad (1\text{-}1)$$

In formula (1-1), $M_1$ may be at least one metal element selected from the group consisting of: the third period elements; Group IIA alkaline earth metal elements; and metal elements belonging to Groups IVB, IIB, VIII, IB, IIIA, IIIB, and IVA. Particularly preferred metal elements include magnesium, calcium, barium, aluminum, tin, titanium, iron, cobalt, nickel, copper, and zinc. In view of chemical and physical stability, the metal element is preferably selected from the group consisting of aluminum, tin, titanium, iron, cobalt, nickel, copper, and zinc; and it most preferably zinc.

In formula (1-1), $R_0$ may be at least one substituent selected from the group consisting of: a monovalent organic group having 3 to 50 carbon atoms including at least one of an alkyl group, an aryl group, an alkoxy group, and an epoxy group; a monovalent organic group having 3 to 50 carbon atoms including a carboxyl group; and a polyalkylene ether group having 3 to 500 carbon atoms. In order to effectively improve the releasability and reduce the surface free energy, $R_0$ is preferably an alkyl group having 10 to 50 carbon atoms. Specifically, in an embodiment of the invention, the metallic soap is preferably a metal salt of a fatty acid such as lauric acid, myristic acid, palmitic acid, stearic acid, or montanoic acid. Preferred examples of the metallic soap include zinc stearate and aluminum stearate. The metallic soap may be produced by well-known methods as described below or obtained as a commercial product. For example, zinc stearate and aluminum stearate as listed above are available under the trade names "Zinc Stearate" and "Aluminum Stearate 300" from NOF CORPORATION, respectively.

Methods for producing the metallic soap are well known, which are broadly divided into: wet methods in which an aqueous solution of an alkali metal salt of an organic acid and a salt of the metal represented by $M_1$ of formula (1-1) are used; and dry methods in which raw materials including a fatty acid and the metal represented by $M_1$ of formula (1-1) are allowed to directly react with each other. In an embodiment of the invention, a free fatty acid and water should be taken into account as critical factors, while any production method may be used. Specifically, under room temperature conditions (0 to 35° C.), the content of free fatty acids in the metallic soap is preferably 20% by weight or less. The content of free fatty acids in the metallic soap is more preferably 10% by weight or less, even more preferably 5% by weight or less, most preferably 0.5% by weight or less. If the content of free fatty acids in the metallic soap is more than 20% by weight, problems may occur, such as a reduction in the curing speed of the resin composition and a reduction in diffuse reflectance or thermal coloration resistance. In addition, under room temperature conditions (0 to 35° C.), the water content of the metallic soap is preferably 10% by weight or less, more preferably 5% by weight or less, even more preferably 3% by weight or less, most preferably 0.5% by weight or less. If the water content of the metallic soap is more than 10% by weight, the molded product obtained by curing the resin composition may have degraded reflow resistance. In this case, problems may also occur, such as a reduction in diffuse reflectance or thermal coloration resistance.

In view of the dispersibility in the base resin including the epoxy resin (A), the curing agent (B) and so on, the metallic soap preferably has a melting point of 100° C. to less than 200° C. The melting point of the metallic salt for use in an embodiment of the invention is more preferably from 100° C. to less than 150° C., particularly preferably from 110° C. to less than 135° C. If a metallic soap with a melting point of 200° C. or more is used, it may be present as a solid at a transfer molding temperature and therefore have poor dispersibility in the base resin. In this case, the metallic soap in the resin composition may unevenly remain solid during the transfer molding process, so that defective mold release may tend to easily occur. If a metallic soap with a melting point of less than 100° C. is used, the resin composition may be reduced in viscosity when kneaded in a mixing roll mill or in a biaxial extrusion process, so that it may tend to fail to ensure sufficient kneadability.

In an embodiment of the invention, at least one compound selected from the group consisting of an aliphatic carboxylic acid, an aliphatic carboxylic acid ester, an aliphatic polyether, a non-oxidized polyolefin, and an oxidized polyolefin having a carboxyl group may be used as the release agent (G). Among such compounds, a colorless compound or a relatively colorless compound such as a light yellow compound is preferably selected in view of application to optical semiconductor element mounting boards.

Examples of the aliphatic carboxylic acid include monovalent organic acids having 10 to 50 carbon atoms, such as lauric acid, myristic acid, palmitic acid, stearic acid, and montanoic acid, which are available as commercial products. For example, Hoechst Wax E (trade name) and Licowax SW (trade name) manufactured by Clariant (Japan) K.K. may be used in an embodiment of the invention.

The aliphatic carboxylic acid ester may be an ester compound obtained from a monovalent organic acid having 10 to 50 carbon atoms and a monovalent alcohol having 10 to 50 carbon atoms, such as a montanoic acid ester or a stearic acid ester. For example, Licowax KST (trade name) manufactured by Clariant (Japan) K.K. is commercially available.

The aliphatic polyether may be a polyalkylene ether compound having 3 to 500 carbon atoms having a structure represented by formula (V) below. For example, UNITOX 420 (trade name) and UNITOX 480 (trade name) manufactured Toyo Petrolite Co., Ltd. are commercially available.

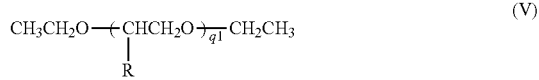

(V)

In the formula, q1 is preferably 20 or less and may be 0, and R is hydrogen, a methyl group, or an organic group having 2 to 10 carbon atoms.

An example of the oxidized or non-oxidized polyolefin includes a low molecular weight polyethylene with a number average molecular weight of 500 to 10,000 commercially available under the trade name "H4", "PE" or "PED" series from Hoechst.

In an embodiment of the invention, the release agent to be used may be not only any of the compounds listed above but also a compound that has generally been used in the field of epoxy resin molding materials for electronic component encapsulation. Examples of such a compound that may be used include, but not limited to, carnauba wax and silicone wax. In an embodiment of the invention, a single compound acting as the release agent may be used alone, or two or more compounds each acting as the release agent may be used in combination.

The release agent (G) is preferably added in an amount of 0.01 to 8 parts by weight, more preferably 0.1 to 3 parts by weight, based on 100 parts by weight of the epoxy resin (A). If the amount of addition of the release agent (G) is less than 0.01 parts by weight, the effect of imparting mold releasability may be insufficient. If the amount of addition of the release agent is more than 8 parts by weight, the board may have reduced adhesion to lead frames and so on.

As described above, the thermosetting light-reflecting resin composition according to the invention includes (A) an epoxy resin, (B) a curing agent, (C) a curing catalyst, (D) an inorganic filler, (E) a white pigment, (F) an additive, and (G) a release agent as essential components. In an embodiment of the invention, if necessary, any of various additional additives may be further added. In an embodiment of the invention, for example, a coupling agent or the like may optionally be added to the thermosetting light-reflecting resin composition in order to improve the interface adhesion between the resin, the inorganic filler and the white pigment. Examples of the coupling agent include, but not limited to, a silane coupling agent and a titanate coupling agent. The silane coupling agent may be a known compound such as an epoxy silane, aminosilane, cationic silane, vinylsilane, acrylic silane, or mercaptosilane coupling agent, or any combination thereof. The amount of the coupling agent may be controlled as needed taking into account the surface coating amount for the inorganic filler. In an embodiment of the invention, the type of the coupling agent and the treatment method are not restricted. In an embodiment of the invention, the content of the coupling agent in the resin composition is preferably 5% by weight or less. Any of various other additives such as an antioxidant, any other release agent, and an ion trapping agent may be further used as a component of the resin composition.

In view of application as a material for optical semiconductor element mounting boards, the thermosetting light-reflecting resin composition according to the invention preferably has good optical properties. Specifically, the resin composition is preferably capable of being thermally cured into a product having a diffuse reflectance (hereinafter also referred to as optical reflectance) of 80% or more at a wavelength of 350 to 800 nm. If the optical reflectance of the cured product is less than 80%, it may tend to fail to sufficiently enhance the brightness of optical semiconductor devices. In the invention, the optical reflectance of the resin composition is preferably 90% or more.

In view of thermal discoloration resistance, the thermosetting light-reflecting resin composition according to the invention is preferably capable of being thermally cured into a product that has an optical reflectance of 80% or more at a wavelength of 350 to 800 nm even after a heat resistance test in which it is allowed to stand in an environment at 150° C. for at least 72 hours and then evaluated. After the heat resistance test, the measured optical reflectance is more preferably 85% or more, even more preferably 90% or more at a wavelength of 400 nm. Such optical reflection characteristics of the resin composition are achieved by appropriately controlling the amount of each component of the resin composition. When the release agent (G) is, but not limited to, a metallic soap in the resin composition according to an embodiment of the invention, the metallic soap has the function of suppressing oxidative degradation of the base resin, so that a high level of thermal discoloration resistance can be achieved.

In view of application as a material for optical semiconductor mounting boards, it is preferred that the thermosetting light-reflecting resin composition according to the invention is capable to perform transfer molding 100 times or more continuously. Every time defective mold release occurs during transfer molding, the transfer molding die has to be cleaned and washed, and an external release agent also has to be applied. If defective mold release frequently occurs, the number of molding processes per unit time is reduced, so that the productivity is significantly reduced. In view of productivity, therefore, it is preferred that the resin composition is capable to stably perform shot molding more than 100 times. As used therein, the expression "it is possible to perform molding continuously" means a state where the "shear release force" is 200 KPa or less. Specifically, if the "shear release force" is continuously kept at 200 KPa or less during 100 shots or more, the following definition is used: "It is possible to perform 100 or more shots of molding continuously."

In an embodiment of the invention, the "shear release force" may be used as an index indicating the degree of releasability of the molded product from the mold in the process of producing an optical semiconductor mounting board with the thermosetting light-reflecting resin composition. More specifically, the shear release force, which is described in detail in Examples, indicates a maximum pulling force measured by a process including forming a disc-shaped product with a diameter of 20 mm on a 50 mm long, 35 mm wide, 0.4 mm thick, chromium-plated stainless steel plate by molding under the conditions of a mold temperature of 180° C., a molding pressure of 6.9 MPa and a curing time of 90 seconds, and then immediately pulling the stainless steel plate, while measuring the maximum pulling force.

From the above point of view, it is preferred that the resin composition of the invention is possible to perform at least 100 shots of molding continuously, more preferably at least 150 shots of molding continuously, particularly preferably at least 200 shots of molding continuously. If the number of continuously performed shots of molding is less than 100, the frequency with which the transfer molding die has to be cleaned and washed after the mold release becomes impossible will increase, so that the productivity will be reduced.

In the process of transfer molding with the resin composition containing the release agent, the release agent bleeds out of the resin composition to form a coating on the mold surface, so that the releasability is improved. Therefore, an embodiment of the invention is intended to include controlling the amount of each component so that the thermosetting light-reflecting resin composition can provide a shear release force of 200 KPa or less within 10 shots of transfer molding when about 10 shots (10 times) or more, preferably about 20 shots (20 times) of transfer molding are continuously performed with the shear release force being measured every shot of molding.

If the resin composition provides a shear release force of more than 200 KPa, the molded product may tend to fail to be released from the mold in the molding process, or a defect such as a poor appearance or a breakage may tend to occur on the molded product, even though it can be released from the mold. In view of various molding characteristics such as releasability, the resin composition should provides a shear release force of at least 200 KPa or less during 10 shots (times) or more, preferably about 20 shots (times) of transfer molding. The shear release force is preferably 150 KPa or less, more preferably 100 KPa or less, even more preferably 50 KPa or less. When such a resin composition is molded into an optical semiconductor mounting board, a mold release defect such as a gate breakage can be reduced.

Some typical conventional resin compositions can provide a shear release force of 200 KPa or less during molding. However, such conventional resin compositions contain a release agent with low dispersibility. Therefore, it tends to be difficult to perform molding processes continuously with them. In fact, when they are used, the shear release force increases every time molding is repeated. In such a case, for example, before about 100 shots of molding are continuously performed and completed, releasing the molded product from the mold becomes difficult, and a defect such as a poor appearance or a breakage is often found in the molded product. In the resin composition according to the invention, however, a specific compound having a polyorganosiloxane moiety improves the dispersibility of the release agent and also functions as a release aid by itself. Therefore, even when about 100 shots of molding are continuously performed, the shear release force can be kept at 200 KPa or less with the resin composition according to the invention, so that the molding process can be performed with high productivity. From these points of view, the resin composition according to the invention preferably provides a shear release force of 200 KPa or less within 10 shots of transfer molding and allows 100 shots or more of molding to be performed continuously. More preferably, the resin composition provides a shear release force of 200 KPa or less at the first shot of transfer molding.

In order to improve the releasability during molding, the thermosetting light-reflecting resin composition according to the invention is preferably capable of being transfer-molded into a product having a surface that is released from a mold and has a controlled surface free energy of 30 mJ/m$^2$ or less. The resin composition is more preferably controlled so that the release surface of the molded product can have a surface free energy of 25 mJ/m$^2$ or less, even more preferably 20 mJ/m$^2$ or less. Generally, in the molding process with a mold, the release agent bleeds out of the resin composition to form a coating on each of the mold surface and the release surface of the molded product, so that the releasability is improved. From this point of view, in an embodiment of the invention, each of the mold surface and the release surface of the molded product preferably has a surface free energy of 30 mJ/m$^2$ or less within 10 shots of transfer molding, when about 10 shots (10 times) or more, preferably about 20 shots (20 times) of transfer molding are continuously performed with the surface free energy being measured every shot of molding. The resin composition is more preferably controlled so that each surface free energy can be 25 mJ/m$^2$ or less, more preferably 20 mJ/m$^2$ or less. If the release surface of the molded product has a surface free energy of 30 mJ/m$^2$ or more, the release agent may be localized in the inside of the molded product, so that the resulting releasability may tend to be insufficient. If the mold surface has a surface free energy of 30 mJ/m$^2$ or more, the release agent may insufficiently bleed out of the molded product, so that the amount of the release agent present on the mold surface may be insufficient and that an oxide film may be formed as a result of oxidation of the mold surface by heat, which may tend to result in insufficient releasability.

As used herein, the term "surface free energy" refers to a parameter indicating the physiochemical properties of the surface of a substance(s) present on the molded product surface or the mold surface. In an embodiment of the invention, the surface free energy may be used as an index for determining whether or not the releasability is good during transfer molding. The surface free energy may be evaluated by a process that includes, but not limited to, performing a well known measurement method such as a static contact angle method (a drop method in which a droplet with a known surface free energy is dropped on a solid surface), a dynamic contact angle method, a sliding method, or a minimal contact angle method, and analyzing the resulting measurement by a well-known method such as Fawkes method, Zisman method, Owens and Wendt method, or Van Oss method. In an embodiment of the invention, the value of the surface free energy may be obtained by the process described below in Examples, which includes performing measurement by a drop method and analyzing the measurement by Van Oss method.

The thermosetting light-reflecting resin composition according to the invention may be prepared by uniformly dispersing and mixing the components illustrated above. The mixing means and conditions are not restricted. A general preparation method includes kneading the components using a mixing roll, an extruder, a kneader, a roll, an extruder, or any other apparatus, and cooling and pulverizing the resulting kneaded product. The kneading method preferably includes, but is not limited to, melting and kneading. The melting and kneading conditions are not restricted and may be appropriately determined depending on the type and amount of each component used.

In an embodiment of the invention, for example, melting and kneading may be performed at a temperature in the range of 15 to 100° C. for 5 to 40 minutes, more preferably at a temperature in the range of 20 to 100° C. for 10 to 30 minutes. If the melting and kneading temperature is less than 15° C., it may be difficult to sufficiently melt and knead the components, so that the dispersibility may tend to be low. If melting and kneading are performed at a temperature higher than 100° C., the resin composition may be polymerized, so that it may be cured before it is molded into a product such as a board. If the melting and kneading time is less than 5 minutes, the resin may bleed out of the mold in the process of forming a board or the like, so that burrs may tend to occur. If it is more than 40 minutes, the resin composition may be polymerized, so that it may be cured before it is molded into a product.

In an embodiment of the invention, at least one of the release agent (G) and the compound used as the additive (F) are preferably premixed with part or all of the epoxy resin (A), when the resin composition is prepared. Such premixing makes it possible to further increase the dispersibility of the release agent in the base resin. As a result, fouling of a mold or a package due to insufficient dispersion of the release agent can be effectively reduced.

The whole amount of the epoxy resin (A) may be premixed with the release agent (G) and/or the compound used as the additive (G). However, premixing with part of the epoxy resin (A) is also sufficiently effective. In this case, 10 to 50% by weight of the total amount of the epoxy resin (A) is preferably used for premixing.

Premixing the epoxy resin (A) with only one of the release agent (G) and the additive (F) is also effective in improving the dispersibility. In order to further increase the effect, however, the three components, the epoxy resin (A), the release agent (G) and the additive (F) should preferably be premixed.

When the three components are premixed, the order of addition is not restricted. For example, all the components may be added and mixed at the same time, or any one of the release agent (G) and the additive (F) may be added to and mixed with the epoxy resin, and then the other component may be added and mixed.

The premixing may be performed by any method, but is not limited to, capable of dispersing the release agent (G) and/or the compound used as the additive (F) into the epoxy resin (A). For example, such a method may include stirring the components at a temperature of room temperature to 220° C. for 0.5 to 20 hours. In view of dispersibility and efficiency, stirring is preferably performed at a temperature of 100 to 200° C., more preferably 150 to 170° C., for a time period of 1 to 10 hours, more preferably 3 to 6 hours.

The optical semiconductor element mounting board of the invention is characterized by being produced with the thermosetting light-reflecting resin composition of the invention described above. Specifically, the optical semiconductor element mounting board has at least one recessed portion that forms an optical semiconductor element mounting region, wherein at least an inner circumference side of the recessed portion is made from the thermosetting light-reflecting resin composition of the invention. FIG. 1 shows an example of the optical semiconductor element mounting board of the invention, in which part (a) is a perspective view, and part (b) is a cross-sectional view along the line Ib-Ib. As shown in FIG. 1, an optical semiconductor element mounting board 110 according to the invention includes a reflector 103; a patterned wiring (lead frame) that is integrated with the reflector 103 and includes a Ni/Ag plating 104 and a metal wiring 105; and a structure having a recessed portion 200 that forms an optical semiconductor element mounting region, wherein at least an inner circumference side of the recessed portion is made from the thermosetting light-reflecting resin composition of the invention.

For example, the optical semiconductor element mounting board of the invention may be manufactured by a method that includes, but is not limited to, transfer molding the thermosetting light-reflecting resin composition of the invention or a tablet-molded product thereof. More specifically, it may be manufactured according to the procedure described below. First, a metal wiring for the optical semiconductor element mounting board is formed by a known method such as punching of a metal foil or etching. The metal wiring is then placed in a mold having a predetermined shape, and the thermosetting light-reflecting resin composition (a melt of a tablet-molded product) is injected from the rein inlet of the mold. The injected resin composition is then preferably cured at a mold temperature of 170 to 190° C. under a molding pressure of 2 to 8 MPa for 60 to 120 seconds. The product is then taken out of the mold and thermally cured at an after curing temperature of 120 to 180° C. for 1 to 3 hours. Ni/silver plating is then performed on the predetermined position of the recessed portion that is surrounded by a reflector made of the curing product of the thermosetting light-reflecting resin composition and forms an optical semiconductor element mounting region.

The optical semiconductor device of the invention includes at least the optical semiconductor element mounting board of the invention described above; an optical semiconductor element mounted on the bottom of the recessed portion of the board; and a fluorescent substance-containing transparent encapsulant resin layer that is formed in the recessed portion so that the optical semiconductor element is covered with it.

Figure 2:
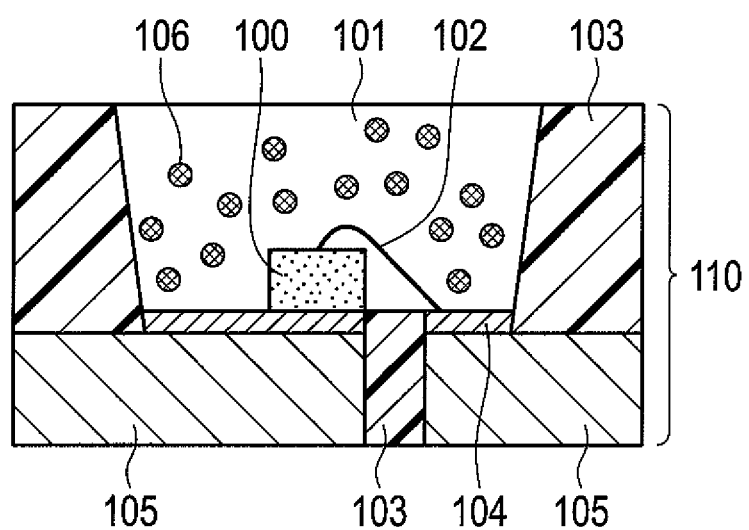
FIG. 2 is a diagram showing an example of the semiconductor device of the invention, in which parts (a) and (b) are each a cross-sectional side view.
Figure 2:
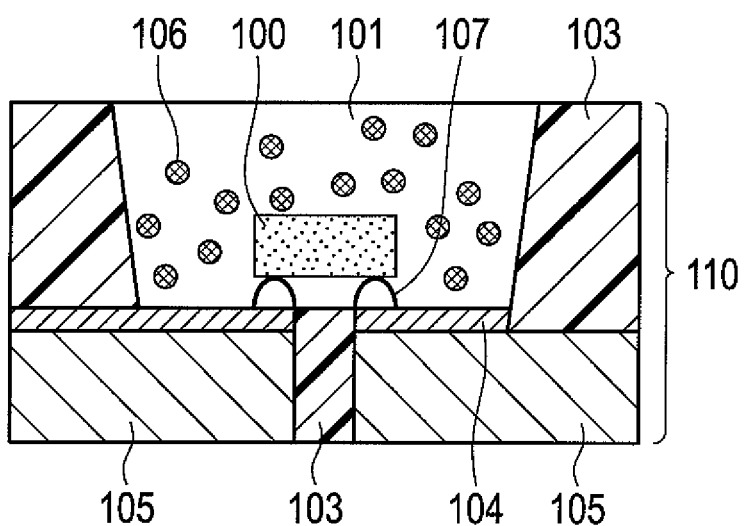
Figure 3:
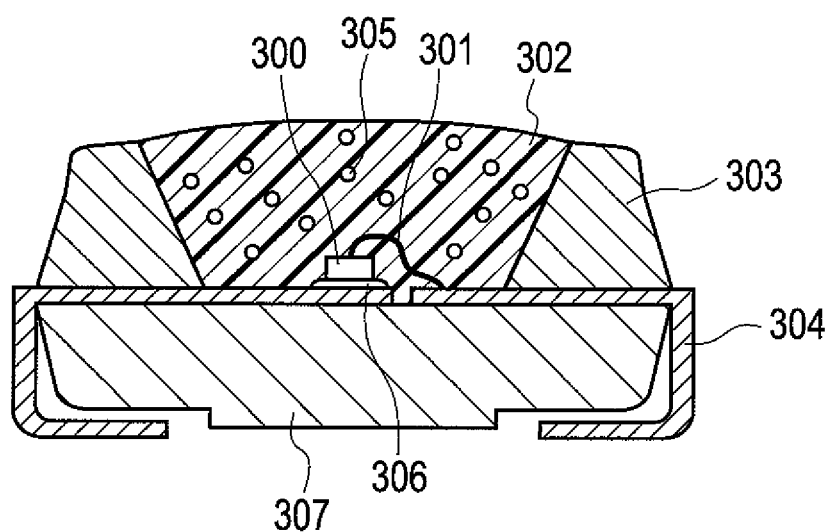
FIG. 3 is a cross-sectional side view showing another example of the optical semiconductor device of the invention.

Parts (a) and (b) of FIG. 2 are each a cross-sectional side view showing an example of the optical semiconductor device of the invention. More specifically, the optical semiconductor device shown in FIG. 2 includes the optical semiconductor element mounting board 110 of the invention; an optical semiconductor element 100 mounted on a predetermined position of the bottom of the recessed portion (reference numeral 200 in FIG. 1) that forms the optical semiconductor element mounting region of the board 110; a metal wiring 105 that is electrically connected to the optical semiconductor element 100 through a Ni/silver plating 104 by known means such as a bonding wire 102 and a solder bump 107; and a transparent encapsulant resin 101 containing a known fluorescent substance 106, with which the optical semiconductor element 100 is covered. FIG. 3 is a cross-sectional side view showing another example of the optical semiconductor device of the invention. In the drawing, each reference numeral is as follows: 300 represents an LED element, 301 a wire bond, 302 a transparent encapsulant resin, 303 a reflector, 304 a lead, 305 a fluorescent substance, 306 a die bond material, and 307 a metal substrate. At least the surface of the recessed portion of the reflector 303 is made from the thermosetting light-reflecting resin composition of the invention.

EXAMPLES

The invention is described in more detail by the examples below, which are not intended to limit the scope of the invention.

Examples A1 to A7

The materials shown below were used in the respective examples.

*1: Triglycidyl isocyanurate (100 in epoxy equivalent, TEPIC-S (trade name), manufactured by NISSAN CHEMICAL INDUSTRIES, LTD.)

*2: Hexahydrophthalic anhydride (manufactured by Wako Pure Chemical Industries, Ltd.)

*3: PX-4ET (trade name), manufactured by Nippon Chemical Industrial Co., Ltd.

*4: Trimethoxyepoxysilane (A-187 (trade name), manufactured by Dow Corning Toray Co., Ltd.)

*5: Fused silica (FB-301 (trade name), manufactured by DENKI KAGAKU KOGYO KABUSHIKI KAISHA)

*6: Hollow particles (S60-HS (trade name), manufactured by Sumitomo 3M Limited)

*7: Alumina (AO-25R (trade name), manufactured by Admatechs)

*8: Additives (see Table 1 below)

*9: Release agent 1 (fatty acid ester, "Hoechst Wax E" (trade name), manufactured by Clariant)

*10: Release agent 2 (aliphatic ether, UNITOX 420 (trade name), manufactured by Toyo Petrolite Co., Ltd.)

The details of the compounds used as the additives are shown in Table 1 below. Compounds [1] to [7] shown in Table 1 are products developed by WACKER ASAHIKASEI SILICONE CO., LTD. and are available as Product No. "SLJ1661" and a series of Product Nos. "SLJ1731 to SLJ1734."

TABLE 1

|  |  | Additives | | | | | | |
|---|---|---|---|---|---|---|---|---|
| Items | | [1] | [2] | [3] | [4] | [5] | [6] | [7] |
| Additive Product No. SLJ | | SLJ 1661-01 | SLJ 1731 | SLJ 1732 | SLJ 1661-02 | SLJ 1733 | SLJ 1734 | SLJ 1661-03 |
| Structural unit components (wt %) | Polycaprolactone $M_{PCL}$ | 50.0 | 30.2 | 39.8 | 50.0 | 59.7 | 69.4 | 50.0 |
| | Polydimethylsiloxane $M_{PDMS}$ | 50.0 | 69.8 | 60.2 | 50.0 | 40.3 | 30.6 | 50.0 |
| Unit number ratio (m/n) | | 0.84 | 0.28 | 0.43 | 0.69 | 0.96 | 1.43 | 0.63 |
| Number average molecular weight Mn | | 4076 | 6205 | 6209 | 6179 | 6155 | 6175 | 10968 |
| Dispersity Mw/Mn | | 1.5 | 1.5 | 1.5 | 1.5 | 1.5 | 1.5 | 1.5 |

The content (% by weight) and the weight ratio (m/n) of the structure unit components shown in Table 1 were determined by calculations for each of the structural unit components represented by formulae (I) and (II), which form the compound, namely, the polycaprolactone moiety ($M_{PCL}$) and the polydimethylsiloxane moiety ($M_{PDMS}$), based on the integrated area of protons measured by $^1$H-NMR spectroscopy. Concerning the weight ratio (m/n), "m" corresponds to the sum of $m_1$ and $m_2$ of formula (III) shown above.

The number average molecular weight (Mn) and the dispersity (Mw/Mn) shown in Table 1 are values each determined by a gel permeation chromatography (GPC) method using a standard polystyrene calibration curve. Specifically, the Mn and Mw were based on values measured by GPC using a pump (Model L-6200, manufactured by Hitachi, Ltd.), columns (TSKgel-G5000HXL and TSKgel-G2000HXL (trade names), all manufactured by TOSOH CORPORATION), a detector (Model L-3300RI, manufactured by Hitachi, Ltd.), and tetrahydrofuran as an eluent under the conditions of a temperature of 30° C. and a flow rate of 1.0 ml/minute.

The raw materials were mixed according to the formulation shown in Table A1 below and sufficiently kneaded in a mixer. The mixture was then molten and kneaded under predetermined conditions in a mixing roll, so that a kneaded product was obtained. The resulting kneaded product was then cooled and pulverized, so that each of thermosetting light-reflecting resin compositions of Examples A1 to A7 was prepared. The units of the amounts of raw material given in each table are all parts by weight, and the "-" section means that the corresponding raw material is not added.

2. Evaluation of Thermosetting Light-Reflecting Resin Compositions

Each of the prepared thermosetting light-reflecting resin compositions of Examples A1 to A7 was subjected to each of the characteristic tests shown below. The results are shown in Table A1 below.

Optical Reflectance

Each prepared thermosetting light-reflecting resin composition was transfer-molded under the conditions of a mold temperature of 180° C., a molding pressure of 6.9 MPa, and a curing time of 90 seconds, and then subjected to post-curing at 150° C. for 2 hours, so that a 1.0 mm thick test piece was obtained. The optical reflectance of each test piece was measured as an initial optical reflectance at a wavelength of 400 nm using an integrating sphere spectrophotometer Model V-750 (manufactured by JASCO Corporation). The prepared test piece was placed in an oven at 150° C. and heat-treated for 72 hours and then measured for optical reflectance in the same manner. The optical reflectance after the heat treatment provided an index of thermal discoloration resistance. Each measured value is shown in Table A1.

For application to optical semiconductor element mounting boards, the value obtained in each measurement is evaluated as shown below.

Criteria for Evaluation of Initial Optical Reflectance

Excellent: The optical reflectance is 90% or more at a light wavelength of 400 nm.

Good: The optical reflectance is from 80% to less than 90% at a light wavelength of 400 nm.

Fair: The optical reflectance is from 70% to less than 80% at a light wavelength of 400 nm.

Poor: The optical reflectance is less than 70% at a light wavelength of 400 nm.

Criteria for Evaluation of Optical Reflectance after 72-hour Heat treatment

Excellent: The optical reflectance is 90% or more at a light wavelength of 400 nm.

Good: The optical reflectance is from 80% to less than 90% at a light wavelength of 400 nm.

Fair: The optical reflectance is from 70% to less than 80% at a light wavelength of 400 nm.

Poor: The optical reflectance is less than 70% at a light wavelength of 400 nm.

Releasability

A mold composed of upper and lower mold parts and having a resin inlet and a cavity for forming a disc-shaped product with a diameter of 20 mm and a thickness of 2 mm was used for measuring shear release force. A 50 mm long, 35 mm wide, 0.4 mm thick chromium-plated, stainless steel plate was inserted into the shear release force measuring mold. The resin composition prepared in each of the examples and the comparative examples was molded on the stainless steel plate. Immediately after the molding, the stainless steel plate was pulled out, while the maximum pulling force was measured with a push pull gauge (Model "SH" manufactured by IMADA SEISAKUSHO CO., LTD.). The molding conditions were as follows: a mold temperature of 180° C., a molding pressure of 6.9 MPa, and a curing time of 90 seconds.

Figure 4:
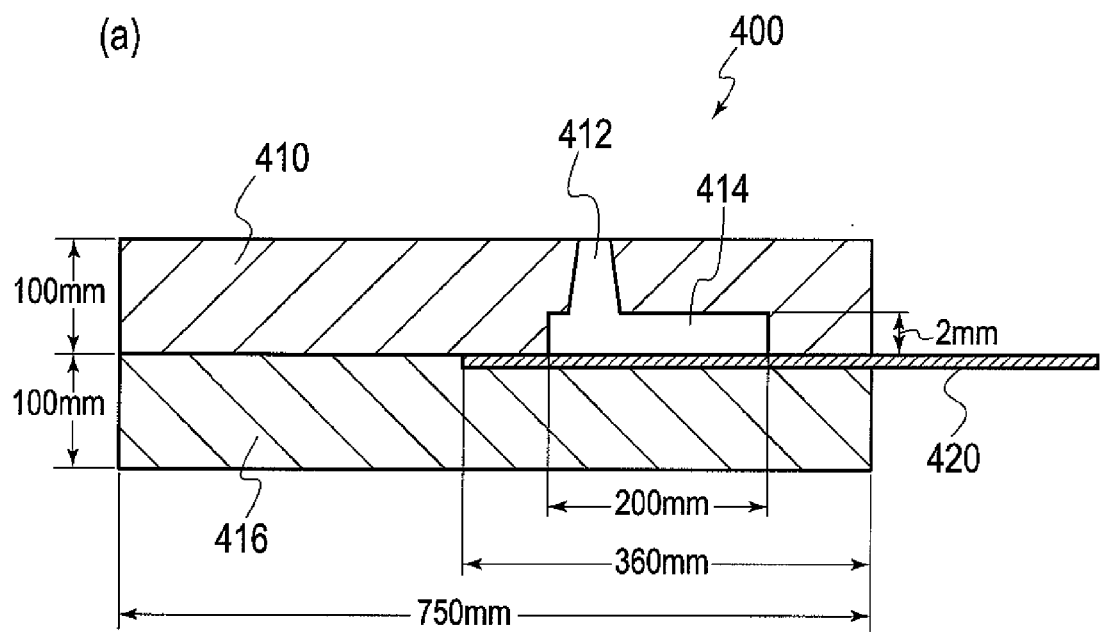
FIG. 4 is a schematic diagram for illustrating a method for evaluating the releasability in an embodiment of the invention, in which part (a) is a cross-sectional side view schematically showing the structure of a shear release force measuring mold, and part (b) is a cross-sectional side view schematically showing the release surface to be measured for free energy.
Figure 4:
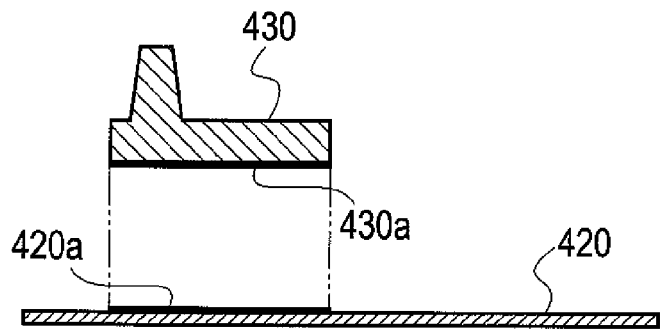

FIG. 4 is a cross-sectional side view schematically showing the shear release force measuring mold. In the drawing, each reference numeral is as follows: 400 the shear release force measuring mold, 410 the upper mold part, 412 the resin inlet, 414 the disc-shaped molding cavity, 416 the lower mold part, and 420 the stainless steel plate. See the numerical values shown in FIG. 4 with respect to the dimension of the mold actually used.

The first value measured according to the above method was defined as the first-shot shear release force. The measurement was continuously repeated using the same stainless steel plate, and the pulling force was measured in the same manner at and after the second shot. It was examined whether or not the pulling force was kept at 200 KPa or less within 10 shots from the first shot. The case where the pulling force was 200 KPa or less was determined as being releasable, and the number of molding shots that could be continuously performed was evaluated. Table A1 shows the value of the 10th-shot shear release force and the number of molding shots that could be continuously performed.

Package Molding Test

The resin composition prepared in each example was subjected to 100 shots of transfer molding using a mold which allowed an ejector pin to perform mold release and with which five frame packages each with an outer size of 10×10×1 mm could be formed on a lead frame. The time required to complete the molding operation was evaluated. In the test of continuous 100 shots of molding, the case where a breakage such as a gate breakage or a runner breakage did not occur on the molded product during the mold release was determined as being continuously moldable and in a good state. In that case, molding was continued. On the other hand, the case where a breakage occurred on the molded product or the case where the releasability was degraded so that the molded product adhered to the mold was determined as being in a state where molding continuation was impossible. In that case, the moldable conditions were recovered by cleaning of the mold or the like, and molding was performed again until the 100th shot was achieved. The molding conditions were as follows: a mold temperature of 180° C., a molding pressure of 6.9 MPa, and a curing time of 90 seconds. The results are shown in Table A1.

Hot Hardness

The resin composition prepared in each example was molded into a disc with a diameter of 50 mm and a thickness of 3 mm using a mold having a given shape. The molding conditions were as follows: a mold temperature of 180° C., a molding pressure of 6.9 MPa, and a curing time of 90 seconds. Immediately after the molding, the hardness of the disc was measured with a shore D hardness tester. The results are shown in Table A1.

Spiral Flow

According to the spiral flow test EMMI-1-66, the resin composition prepared in each example was molded under predetermined conditions using a spiral flow measuring mold, while the distance (cm) of flow of the resin composition was measured. The results are shown in Table A1.

TABLE A1

|  |  |  | Examples | | | | | | |
| --- | --- | --- | --- | --- | --- | --- | --- | --- | --- |
|  |  | Items | 1 | 2 | 3 | 4 | 5 | 6 | 7 |
| Ingredients | Epoxy resin | Trisglycidyl isocyanurate (*1) | 100 | 100 | 100 | 100 | 100 | 100 | 100 |
|  | Curing agent | Hexahydrophthalic anhydride (*2) | 123.4 | 123.4 | 123.4 | 123.4 | 123.4 | 123.4 | 123.4 |
|  |  | (equivalents based on 1 equivalent of epoxy group) | (0.8) | (0.8) | (0.8) | (0.8) | (0.8) | (0.8) | (0.8) |
|  | Curing catalyst | Tetra-n-butylphosphonium-o,o-diethylphosphorodithioate (*3) | 3.4 | 3.4 | 3.4 | 3.4 | 3.4 | 3.4 | 3.4 |

TABLE A1-continued

|  |  | Items | Examples | | | | | | |
|---|---|---|---|---|---|---|---|---|---|
|  |  |  | 1 | 2 | 3 | 4 | 5 | 6 | 7 |
|  | Coupling agent | Trimethoxy epoxysilane (*4) | 7.0 | 7.0 | 7.0 | 7.0 | 7.0 | 7.0 | 7.0 |
|  | Inorganic filler | Spherical fused silica (6 μm in center particle size) (*5) | 796 | 796 | 796 | 796 | 796 | 796 | 796 |
|  | White pigment | Hollow particles (27 μm in center particle size) (*6) | 217 | 217 | 217 | 217 | 217 | 217 | 217 |
|  |  | Alumina (1 μm in center particle size) (*7) | 705 | 705 | 705 | 705 | 705 | 705 | 705 |
|  | Additive 1 | (*8) | 10 |  |  |  |  |  |  |
|  | Additive 2 |  |  | 10 |  |  |  |  |  |
|  | Additive 3 |  |  |  | 10 |  |  |  |  |
|  | Additive 4 |  |  |  |  | 10 |  |  |  |
|  | Additive 5 |  |  |  |  |  | 10 |  |  |
|  | Additive 6 |  |  |  |  |  |  | 10 |  |
|  | Additive 7 |  |  |  |  |  |  |  |  | 10 |
|  | Release agent | Release agent 1 (*9) | 1.0 | 1.0 | 1.0 | 1.0 | 1.0 | 1.0 | 1.0 |
|  |  | Release agent 2 (*10) | 1.0 | 1.0 | 1.0 | 1.0 | 1.0 | 1.0 | 1.0 |
|  |  | Release agent 3 (*11) |  |  |  |  |  |  |  |
|  |  | Release agent 4 (*12) |  |  |  |  |  |  |  |
| Characteristics | Initial optical reflectance (%) |  | 97 | 97 | 96 | 97 | 98 | 96 | 97 |
|  | Optical reflectance (%) after heat treatment |  | 92 | 91 | 91 | 92 | 90 | 91 | 91 |
|  | Spiral flow (cm) |  | 120 | 110 | 125 | 122 | 120 | 115 | 104 |
|  | 10th shot shear release force (KPa) |  | 20 | 50 | 20 | 20 | 20 | 20 | 20 |
|  | Number of times of molding continuation (number of shots) |  | 130~ | 130~ | 130~ | 130~ | 130~ | 130~ | 130~ |
|  | Hot hardness (shore D) |  | 88 | 87 | 88 | 89 | 86 | 88 | 89 |
|  | Time required for 100-shot molding operation (h) |  | 8 | 8 | 8 | 8 | 8 | 8 | 8 |

Comparative Examples A1 to A11

The raw materials were mixed according to the formulation shown in Table A2 below. Each thermosetting light-reflecting resin composition was prepared and evaluated in the same manner as described above for Examples A1 to A7. The results are shown in Table A2.

The resin compositions of Comparative Examples A1 to A9 were prepared using the raw materials of Examples A1 to A7, except for the compounds used as additives. The resin compositions of Comparative Examples A10 and A11 were prepared using the raw materials of Examples A1 to A7, except for the compounds used as release agents. The details of Additives 8 to 10 used in Comparative Examples A1 to A9 and release agents used in Comparative Examples A10 and A11 are as follows.

Additive 8: S2001 (trade name) manufactured by Mitsubishi Rayon Co., Ltd., which is a core-shell fine particle compound composed of a core of an acrylonitrile-styrene-dimethylsiloxane-alkyl acrylate copolymer and a shell of poly(methyl methacrylate) and having an average particle size of 0.3 μm.

Additive 9: KS5535 (trade name) manufactured by Mitsubishi Rayon Co., Ltd., which is a core-shell fine particle compound composed of a core of acrylic rubber and a shell of poly(methyl methacrylate) and having an average particle size of 0.3 μm.

Additive 10: SRK200 (trade name) manufactured by Mitsubishi Rayon Co., Ltd., which is a core-shell fine particle compound composed of a core of an acrylonitrile-styrene-dimethylsiloxane-alkyl acrylate copolymer and a shell of acrylonitrile and having an average particle size of 0.3 μm.

Release agent 3: carnauba wax (Carnauba Wax (trade name), manufactured by TOA KASEI CO., LTD.)

Release agent 4: silicone wax (KF901 (trade name), manufactured by Mitsubishi Rayon Co., Ltd., a polyalkylsiloxane compound having a siloxane main chain)

TABLE A2

|  |  | Items | Comparative Examples | | | | | |
|---|---|---|---|---|---|---|---|---|
|  |  |  | 1 | 2 | 3 | 4 | 5 | 6 |
| Ingredients | Epoxy resin | Trisglycidyl isocyanurate (*1) | 100 | 100 | 100 | 100 | 100 | 100 |
|  | Curing agent | Hexahydrophthalic anhydride (*2) | 123.4 | 123.4 | 123.4 | 123.4 | 123.4 | 123.4 |
|  |  | (equivalents based on 1 equivalent of epoxy group) | (0.8) | (0.8) | (0.8) | (0.8) | (0.8) | (0.8) |
|  | Curing catalyst | Tetra-n-butylphosphonium-o,o-diethylphosphorodithioate (*3) | 2.2 | 3.4 | 2.2 | 3.4 | 3.4 | 3.4 |
|  | Coupling agent | Trimethoxy epoxysilane (*4) | 7.0 | 7.0 | 7.0 | 7.0 | 7.0 | 7.0 |
|  | Inorganic filler | Spherical fused silica (6 μm in center particle size) (*5) | 796 | 796 | 796 | 796 | 796 | 796 |
|  | White pigment | Hollow particles (27 μm in center particle size) (*6) | 217 | 217 | 217 | 217 | 217 | 217 |
|  |  | Alumina (1 μm in center particle size) (*7) | 705 | 705 | 705 | 705 | 705 | 705 |
|  | Additive 4 | (*8) |  |  |  |  |  |  |
|  | Additive 8 |  |  |  |  |  |  |  |
|  | Additive 9 |  |  |  |  |  |  |  |

TABLE A2-continued

|  |  |  |  |  |  |  |  |
|---|---|---|---|---|---|---|---|
|  | Additive 10 |  |  |  |  |  |  |
|  | Release agent | Release agent 1 (*9) | 1.0 | 1.0 | 1.0 | 2.0 | 2.0 |  |
|  |  | Release agent 2 (*10) | 1.0 | 1.0 | 1.0 | 2.0 |  | 2.0 |
|  |  | Release agent 3 (*11) |  |  |  |  |  |  |
|  |  | Release agent 4 (*12) |  |  |  |  |  |  |
| Characteristics | Initial optical reflectance (%) |  | 95 | 98 | 97 | 96 | 96 | 97 |
|  | Optical reflectance (%) after heat treatment |  | 91 | 89 | 92 | 87 | 88 | 87 |
|  | Spiral flow (cm) |  | 120 | 180 | 180 | 180 | 130 | 125 |
|  | 10th shot shear release force (KPa) |  | 20 | 50 | 20 | 50 | 550 | 650 |
|  | Number of times of molding continuation (number of shots) |  | ~80 | ~75 | ~75 | ~75 | ~10 | ~10 |
|  | Hot hardness (shore D) |  | 88 | 86 | 86 | 86 | 89 | 88 |
|  | Time required for 100-shot molding operation (h) |  | 8.7 | 8.7 | 8.7 | 8.5 | 13 | 13.3 |

|  |  |  | Comparative Examples |  |  |  |  |
|---|---|---|---|---|---|---|---|
|  |  | Items | 7 | 8 | 9 | 10 | 11 |
| Ingredients | Epoxy resin | Trisglycidyl isocyanurate (*1) | 100 | 100 | 100 | 100 | 100 |
|  | Curing agent | Hexahydrophthalic anhydride (*2) (equivalents based on 1 equivalent of epoxy group) | 123.4 (0.8) | 123.4 (0.8) | 123.4 (0.8) | 123.4 (0.8) | 123.4 (0.8) |
|  | Curing catalyst | Tetra-n-butylphosphonium-o,o-diethylphosphorodithioate (*3) | 3.4 | 3.4 | 3.4 | 3.4 | 3.4 |
|  | Coupling agent | Trimethoxy epoxysilane (*4) | 7.0 | 7.0 | 7.0 | 7.0 | 7.0 |
|  | Inorganic filler | Spherical fused silica (6 µm in center particle size) (*5) | 796 | 796 | 796 | 796 | 796 |
|  | White pigment | Hollow particles (27 µm in center particle size) (*6) | 217 | 217 | 217 | 217 | 217 |
|  |  | Alumina (1 µm in center particle size) (*7) | 705 | 705 | 705 | 705 | 705 |
|  | Additive 4 | (*8) |  |  |  | 10 | 10 |
|  | Additive 8 |  | 15 |  |  |  |  |
|  | Additive 9 |  |  | 15 |  |  |  |
|  | Additive 10 |  |  |  | 15 |  |  |
|  | Release agent | Release agent 1 (*9) | 1.0 | 1.0 | 1.0 |  |  |
|  |  | Release agent 2 (*10) | 1.0 | 1.0 | 1.0 |  |  |
|  |  | Release agent 3 (*11) |  |  |  | 2.0 |  |
|  |  | Release agent 4 (*12) |  |  |  |  | 2.0 |
| Characteristics | Initial optical reflectance (%) |  | 97 | 96 | 95 | 89 | 86 |
|  | Optical reflectance (%) after heat treatment |  | 91 | 90 | 90 | 80 | 78 |
|  | Spiral flow (cm) |  | 110 | 103 | 109 | 107 | 115 |
|  | 10th shot shear release force (KPa) |  | 800 | 750 | 800 | 400 | 500 |
|  | Number of times of molding continuation (number of shots) |  | ~5 | ~5 | ~5 | ~5 | ~5 |
|  | Hot hardness (shore D) |  | 88 | 88 | 88 | 88 | 88 |
|  | Time required for 100-shot molding operation (h) |  | 18 | 17 | 18.5 | 18.4 | 18 |

Figure 5:
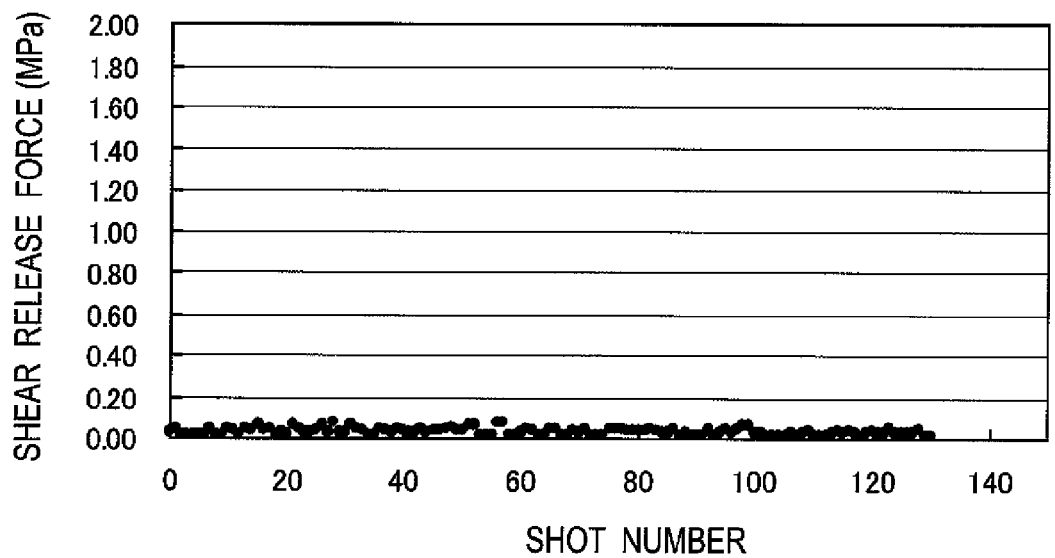
FIG. 5 shows the relationship between the number of continuous shots of molding and the shear release force, in which part (a) is a graph showing a case where the resin composition of Example A1 is used, and part (b) is a graph showing a case where the resin composition of Comparative Example A1 is used.
Figure 5:
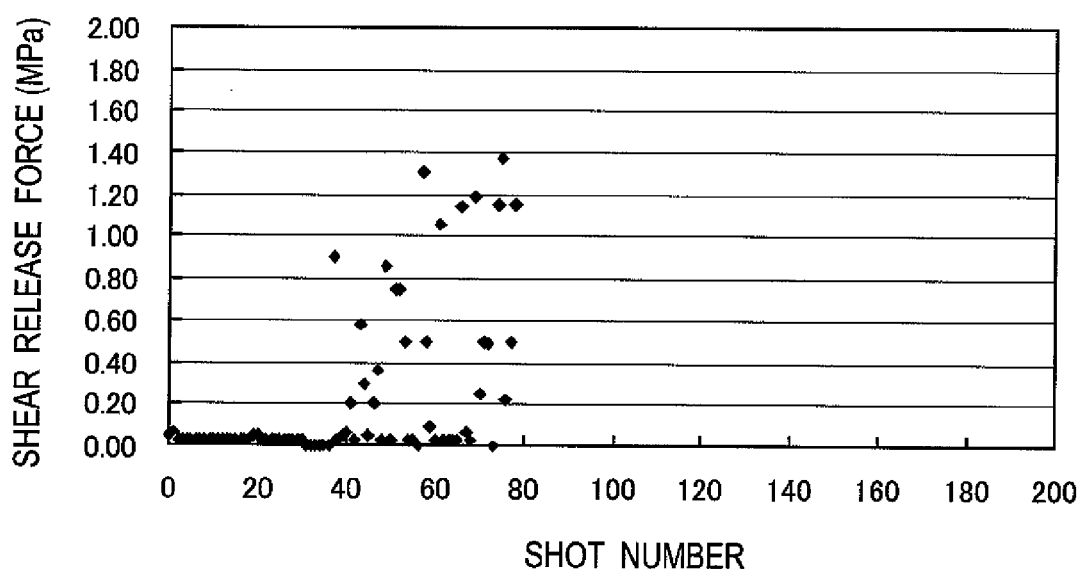

Tables A1 and A2 show that when the resin composition of each of Examples A1 to A7 according to the invention is used in which a specific compound having a polyorganosiloxane moiety is present, the molten resin in the mold is prevented from being reduced in fluidity during transfer molding, and the mold releasability is dramatically improved. More specifically, the number of times of molding continuation (the number of shots) increases 130 or more in Examples A1 to A7, while it is around 75 in Comparative Examples A1 to A6. FIG. 5 provides graphs showing the relationship between the number of shots and the shear release force in the continuous molding operation with respect to Example A1 and Comparative Example A1 as representatives. Part (a) of FIG. 5 is a graph showing the case where the resin composition of Example A1 was used, and part (b) of FIG. 5 is a graph showing the case where the resin composition of Comparative Example A1 was used. Part (a) of FIG. 5 shows that when the resin composition of Example A1 as a typical example of the invention is used, the shear release force is kept at 0.2 MPa (200 KPa) or less until continuous 100 shots of molding are completed and even after the 100th shot, and no defect such as adhesion of the molded product to the mold is observed. In contrast, part (b) of FIG. 5 shows that when the resin composition does not contain a specific compound having a polyorganosiloxane moiety (as typified by Comparative Example A1), the number of continuously performed shots of molding is limited to around 75. Also in this case, the shear release force sometimes exceeds 0.2 MPa (200 KPa) before continuous 75 shots of molding are completed. In such a case, a defect such as adhesion of the molded product (such as a package) to the mold or a gate breakage occurs to make it difficult to perform continuous molding in a satisfactory manner.

When the resin composition of each of Comparative Examples A1 to A4 was used, a shear release force of 200 KPa was achieved within 10 shots of molding, but the number of continuously performed shots of molding was 80 or less, which resulted in poor molding. This may be because the release agent is insufficiently dispersed, so that a stain responsible for a reduction in releasability is accumulated every shot, which makes mold release impossible within a small number of shots. When the resin composition of each of Comparative Examples A5 to A11 was used, a shear release force of 200 KPa or less was not achieved within 10 shots of molding, and it was very difficult to perform continuous molding in a satisfactory manner.

The result of package molding test shows that when the resin composition of each of Examples A1 to A7 was used, continuous molding was performed in a satisfactory manner during the time when products (optical semiconductor element mounting board samples) were prepared by molding, and no mold-cleaning process was necessary, so that the samples were prepared with high time efficiency with no interruption of molding. In contrast, when the resin composition of each of Comparative Examples A1 to A9 was used, several times of mold cleaning were necessary until 100 shots of molding were completed, so that it took a long time to complete the molding operation. This indicates that the resin composition of the invention has high molding workability.

In Comparative Examples A7 to A9 using well-known compounds as the additive and the dispersing agent, the releasability was not improved. This suggests that the dispersibility of the compound itself used as the additive in the base resin may have an effect on the improvement of the dispersibility of the release agent. The curing product of the resin composition of each of Examples A1 to A7 according to the invention was destroyed, and the resulting fracture surface was observed with an electron microscope. As a result, no clear interface was observed. This indicates that the compound used as a modifier was microphase-separated in the resin components such as the epoxy resin and the curing agent, so that it was dissolved together with the resin components. On the other hand, the curing product of the resin composition of each of Comparative Examples A7 to A9 was destroyed, and the resulting fracture surface was observed in the same manner. As a result, a clear interface was observed. This indicates that in comparison with Comparative Example A8, the compound used as a modifier according to the invention increases the affinity for the resin components due to the moiety derived from caprolactone or the like, so that the compatibility is improved. In comparison with Comparative Examples A7 and A9, it is also apparent that if the molecular weight of the compound is too high, the compound has low compatibility with the resin components even when it contains a polydimethylsiloxane moiety and an ester moiety. In general, the molecular weight, repeating monomer units and polymerization degree of core-shell fine particle compounds as used in the comparative examples are designed to make the compounds insoluble in general-purpose organic solvents. Therefore, such compounds have low solubility and are present in the form of particles in a solvent. Actually, the compounds used in Comparative Examples A7 to A9 are not dissolved in tetrahydrofuran to such an extent that a colorless, clear solution is obtained. The compounds used in Comparative Examples A7 to A9 may be considered to have very high molecular weights, as compared with the compounds used in Examples A1 to A7, although such molecular weights cannot be determined by the GPC method described herein. Such compounds caused a phenomenon in which fine particles tend to aggregate, even when they were uniform in fine particle size.

Examples B1 to B14 and Comparative Examples B1 to B14

1. Preparation of Thermosetting Light-Reflecting Resin Compositions

The raw materials were mixed according to the formulation shown in Tables B1 and B2 below and sufficiently kneaded in a mixer. The mixture was then molten and kneaded under predetermined conditions in a mixing roll, so that a kneaded product was obtained. The resulting kneaded product was then cooled and pulverized, so that each of thermosetting light-reflecting resin compositions of Examples B1 to B14 and Comparative Examples B1 to B14 was prepared. The units of the amounts of raw material given in each table are all parts by weight, and the "-" section means that the corresponding raw material is not added.

2. Evaluation of Thermosetting Light-Reflecting Resin Compositions

Each of the prepared thermosetting light-reflecting resin compositions of Examples B1 to B14 and Comparative Examples B1 to B14 was subjected to each of the characteristic tests in the same manner as for Examples A1 to A7 and Comparative Examples A1 to A11. The long-term thermal discoloration resistance was evaluated as described below. The results of each test are shown in Tables B1 and B2 below.

Long-Term Thermal Discoloration Resistance

The test piece was heat-treated for 500 hours similarly to the method of evaluating the optical reflectance after heat treatment, described above in the examples, and then the optical reflectance of the test piece was measured and used as an index of long-term thermal discoloration resistance. For application to optical semiconductor element mounting boards, the value obtained in each measurement is evaluated as shown below.

Criteria for Evaluation of Long-Term Thermal Discoloration Resistance (Optical Reflectance after 500-Hour Heat Treatment)

Excellent: The optical reflectance is 90% or more at a light wavelength of 400 nm.

Good: The optical reflectance is from 80% to less than 90% at a light wavelength of 400 nm.

Fair: The optical reflectance is from 70% to less than 80% at a light wavelength of 400 nm.

Poor: The optical reflectance is less than 70% at a light wavelength of 400 nm.

TABLE B1

| | | | Examples | | | | | | |
|---|---|---|---|---|---|---|---|---|---|
| | | Items | 1 | 2 | 3 | 4 | 5 | 6 | 7 |
| Ingredients | Epoxy resin | Trisglycidyl isocyanurate (*1) | 100 | 100 | 100 | 100 | 100 | 100 | 100 |
| | Curing agent | Hexahydrophthalic anhydride (*2) | 123.4 | 123.4 | 123.4 | 123.4 | 123.4 | 123.4 | 123.4 |
| | | (equivalents based on 1 equivalent of epoxy group) | (0.8) | (0.8) | (0.8) | (0.8) | (0.8) | (0.8) | (0.8) |
| | Curing catalyst | Tetra-n-butylphosphonium-o,o-diethylphosphorodithioate (*3) | 3.4 | 3.4 | 3.4 | 3.4 | 3.4 | 3.4 | 3.4 |
| | Coupling agent | Trimethoxy epoxysilane (*4) | 7.0 | 7.0 | 7.0 | 7.0 | 7.0 | 7.0 | 7.0 |
| | Inorganic filler | Spherical fused silica (6 μm in center particle size) (*5) | 796 | 796 | 796 | 796 | 796 | 796 | 796 |
| | White pigment | Hollow particles (27 μm in center particle size) (*6) | 217 | 217 | 217 | 217 | 217 | 217 | 217 |

TABLE B1-continued

|  |  |  | | | | | | | |
|---|---|---|---|---|---|---|---|---|---|
| | | Alumina (1 μm in center particle size) (*7) | 705 | 705 | 705 | 705 | 705 | 705 | 705 |
| | Additive 1 (*8) | | 10 | | | | | | |
| | Additive 2 | | | 10 | | | | | |
| | Additive 3 | | | | 10 | | | | |
| | Additive 4 | | | | | 10 | | | |
| | Additive 5 | | | | | | 10 | | |
| | Additive 6 | | | | | | | 10 | |
| | Additive 7 | | | | | | | | 10 |
| | Release agent | Release agent 1 (*9) | 1.0 | 1.0 | 1.0 | 1.0 | 1.0 | 1.0 | 1.0 |
| | | Release agent 2 (*10) | | | | | | | |
| | | Release agent 3 (*11) | | | | | | | |
| | | Release agent 4 (*12) | | | | | | | |
| | | Release agent 5 (*13) | | | | | | | |
| | | Release agent 6 (*14) | | | | | | | |
| Characteristics | Initial optical reflectance (%) | | 97 | 98 | 97 | 96 | 97 | 97 | 97 |
| | Optical reflectance (%) after 72 h heat treatment | | 94 | 93 | 93 | 92 | 94 | 92 | 94 |
| | Optical reflectance (%) after 500 h heat treatment | | 87 | 88 | 86 | 88 | 87 | 86 | 88 |
| | Spiral flow (cm) | | 120 | 110 | 125 | 122 | 120 | 115 | 113 |
| | Shear release force (first shot, KPa) | | 20 | 20 | 50 | 20 | 50 | 20 | 20 |
| | Shear release force (10th shot, KPa) | | 20 | 20 | 20 | 20 | 20 | 20 | 20 |
| | Number of times of molding continuation | | >200 | >200 | >200 | >200 | >200 | >200 | >200 |
| | Hot hardness (shore D) | | 88 | 87 | 88 | 89 | 86 | 88 | 89 |

|  |  |  | Examples | | | | | | |
|---|---|---|---|---|---|---|---|---|---|
| | | Items | 8 | 9 | 10 | 11 | 12 | 13 | 14 |
| Ingredients | Epoxy resin | Trisglycidyl isocyanurate (*1) | 100 | 100 | 100 | 100 | 100 | 100 | 100 |
| | Curing agent | Hexahydrophthalic anhydride (*2) | 123.4 | 123.4 | 123.4 | 123.4 | 123.4 | 123.4 | 123.4 |
| | | (equivalents based on 1 equivalent of epoxy group | (0.8) | (0.8) | (0.8) | (0.8) | (0.8) | (0.8) | (0.8) |
| | Curing catalyst | Tetra-n-butylphosphonium-o,o-diethylphosphorodithioate (*3) | 3.4 | 3.4 | 3.4 | 3.4 | 3.4 | 3.4 | 3.4 |
| | Coupling agent | Trimethoxy epoxysilane (*4) | 7.0 | 7.0 | 7.0 | 7.0 | 7.0 | 7.0 | 7.0 |
| | Inorganic filler | Spherical fused silica (6 μm in center particle size) (*5) | 796 | 796 | 796 | 796 | 796 | 796 | 796 |
| | White pigment | Hollow particles (27 μm in center particle size) (*6) | 217 | 217 | 217 | 217 | 217 | 217 | 217 |
| | | Alumina (1 μm in center particle size) (*7) | 705 | 705 | 705 | 705 | 705 | 705 | 705 |
| | Additive 1 (*8) | | 10 | | | | | | |
| | Additive 2 | | | 10 | | | | | |
| | Additive 3 | | | | 10 | | | | |
| | Additive 4 | | | | | 10 | | | |
| | Additive 5 | | | | | | 10 | | |
| | Additive 6 | | | | | | | 10 | |
| | Additive 7 | | | | | | | | 10 |
| | Release agent | Release agent 1 (*9) | | | | | | | |
| | | Release agent 2 (*10) | 1.0 | 1.0 | 1.0 | 1.0 | 1.0 | 1.0 | 1.0 |
| | | Release agent 3 (*11) | | | | | | | |
| | | Release agent 4 (*12) | | | | | | | |
| | | Release agent 5 (*13) | | | | | | | |
| | | Release agent 6 (*14) | | | | | | | |
| Characteristics | Initial optical reflectance (%) | | 98 | 97 | 98 | 97 | 96 | 97 | 98 |
| | Optical reflectance (%) after 72 h heat treatment | | 93 | 94 | 93 | 94 | 93 | 94 | 92 |
| | Optical reflectance (%) after 500 h heat treatment | | 87 | 88 | 89 | 87 | 87 | 87 | 86 |
| | Spiral flow (cm) | | 120 | 110 | 125 | 122 | 120 | 115 | 104 |
| | Shear release force (first shot, KPa) | | 20 | 50 | 50 | 20 | 50 | 20 | 20 |
| | Shear release force (10th shot, KPa) | | 20 | 20 | 20 | 20 | 20 | 20 | 20 |
| | Number of times of molding continuation | | >200 | >200 | >200 | >200 | >200 | >200 | >200 |
| | Hot hardness (shore D) | | 88 | 87 | 88 | 89 | 86 | 88 | 89 |

TABLE B2

|  |  |  | Comparative Examples | | | | | | |
|---|---|---|---|---|---|---|---|---|---|
| | | Items | 1 | 2 | 3 | 4 | 5 | 6 | 7 |
| Ingredients | Epoxy resin | Trisglycidyl isocyanurate (*1) | 100 | 100 | 100 | 100 | 100 | 100 | 100 |
| | Curing agent | Hexahydrophthalic anhydride (*2) | 123.4 | 123.4 | 123.4 | 123.4 | 123.4 | 123.4 | 123.4 |
| | | (equivalents based on 1 equivalent of epoxy group | (0.8) | (0.8) | (0.8) | (0.8) | (0.8) | (0.8) | (0.8) |
| | Curing catalyst | Tetra-n-butylphosphonium-o,o-diethylphosphorodithioate (*3) | 2.2 | 3.4 | 2.2 | 3.4 | 3.4 | 3.4 | 3.4 |
| | Coupling agent | Trimethoxy epoxysilane (*4) | 7.0 | 7.0 | 7.0 | 7.0 | 7.0 | 7.0 | 7.0 |
| | Inorganic filler | Spherical fused silica (6 μm in center particle size) (*5) | 796 | 796 | 796 | 796 | 796 | 796 | 796 |
| | White pigment | Hollow particles (27 μm in center particle size) (*6) | 217 | 217 | 217 | 217 | 217 | 217 | 217 |

TABLE B2-continued

|  |  |  | | | | | | | |
|---|---|---|---|---|---|---|---|---|---|
|  |  | Alumina (1 μm in center particle size) (*7) | 705 | 705 | 705 | 705 | 705 | 705 | 705 |
|  | Additive 4 | (*8) |  |  | 5 | 10 |  |  |  |
|  | Additive 8 |  |  |  |  |  | 15 |  |  |
|  | Additive 9 |  |  |  |  |  |  | 15 |  |
|  | Additive 10 |  |  |  |  |  |  |  | 15 |
|  | Release agent | Release agent 1 (*9) | 1.0 |  |  |  | 1.0 | 1.0 | 1.0 |
|  |  | Release agent 2 (*10) |  | 1.0 |  |  |  |  |  |
|  |  | Release agent 3 (*11) |  |  |  |  |  |  |  |
|  |  | Release agent 4 (*12) |  |  |  |  |  |  |  |
|  |  | Release agent 5 (*13) |  |  |  |  |  |  |  |
|  |  | Release agent 6 (*14) |  |  |  |  |  |  |  |
| Characteristics | Initial optical reflectance (%) |  | 97 | 98 | 97 | 97 | 94 | 95 | 92 |
|  | Optical reflectance (%) after 72 h heat treatment |  | 93 | 92 | 93 | 93 | 92 | 91 | 90 |
|  | Optical reflectance (%) after 500 h heat treatment |  | 87 | 87 | 85 | 86 | 87 | 86 | 85 |
|  | Spiral flow (cm) |  | 120 | 180 | 180 | 180 | 130 | 125 | 110 |
|  | Shear release force (first shot, KPa) |  | 900 | 850 | 500 | 650 | 900 | 850 | 550 |
|  | Shear release force (10th shot, KPa) |  | 900 | 750 | 650 | 700 | 800 | 700 | 550 |
|  | Number of times of molding continuation |  | 0 | 0 | 0 | 0 | 0 | 0 | 0 |
|  | Hot hardness (shore D) |  | 88 | 86 | 86 | 86 | 89 | 88 | 88 |

|  |  |  | Comparative Examples | | | | | | |
|---|---|---|---|---|---|---|---|---|---|
|  |  | Items | 8 | 9 | 10 | 11 | 12 | 13 | 14 |
| Ingredients | Epoxy resin | Trisglycidyl isocyanurate (*1) | 100 | 100 | 100 | 100 | 100 | 100 | 100 |
|  | Curing agent | Hexahydrophthalic anhydride (*2) | 123.4 | 123.4 | 123.4 | 123.4 | 123.4 | 123.4 | 123.4 |
|  |  | (equivalents based on 1 equivalent of epoxy group) | (0.8) | (0.8) | (0.8) | (0.8) | (0.8) | (0.8) | (0.8) |
|  | Curing catalyst | Tetra-n-butylphosphonium-o,o-diethylphosphorodithioate (*3) | 3.4 | 3.4 | 3.4 | 3.4 | 3.4 | 3.4 | 3.4 |
|  | Coupling agent | Trimethoxy epoxysilane (*4) | 7.0 | 7.0 | 7.0 | 7.0 | 7.0 | 7.0 | 7.0 |
|  | Inorganic filler | Spherical fused silica (6 μm in center particle size) (*5) | 796 | 796 | 796 | 796 | 796 | 796 | 796 |
|  | White pigment | Hollow particles (27 μm in center particle size) (*6) | 217 | 217 | 217 | 217 | 217 | 217 | 217 |
|  |  | Alumina (1 μm in center particle size) (*7) | 705 | 705 | 705 | 705 | 705 | 705 | 705 |
|  | Additive 4 | (*8) |  |  | 10 | 10 | 10 | 10 | 10 |
|  | Additive 8 |  | 15 |  |  |  |  |  |  |
|  | Additive 9 |  |  | 15 |  |  |  |  |  |
|  | Additive 10 |  |  |  |  |  |  |  |  |
|  | Release agent | Release agent 1 (*9) |  |  |  |  |  |  |  |
|  |  | Release agent 2 (*10) | 1.0 | 1.0 |  |  |  |  |  |
|  |  | Release agent 3 (*11) |  |  | 2.0 |  |  |  |  |
|  |  | Release agent 4 (*12) |  |  |  | 2.0 |  |  |  |
|  |  | Release agent 5 (*13) |  |  |  |  | 2.0 |  | 1.0 |
|  |  | Release agent 6 (*14) |  |  |  |  |  | 2.0 | 1.0 |
| Characteristics | Initial optical reflectance (%) |  | 96 | 97 | 92 | 94 | 88 | 93 | 92 |
|  | Optical reflectance (%) after 72 h heat treatment |  | 93 | 92 | 83 | 82 | 72 | 83 | 84 |
|  | Optical reflectance (%) after 500 h heat treatment |  | 87 | 86 | 76 | 73 | 63 | 75 | 74 |
|  | Spiral flow (cm) |  | 103 | 109 | 107 | 115 | 118 | 121 | 116 |
|  | Shear release force (first shot, KPa) |  | 750 | 750 | 250 | 300 | 350 | 300 | 300 |
|  | Shear release force (10th shot, KPa) |  | 550 | 600 | 300 | 250 | 300 | 20 | 20 |
|  | Number of times of molding continuation |  | 0 | 0 | 75 | 50 | 20 | 15 | 15 |
|  | Hot hardness (shore D) |  | 88 | 88 | 88 | 88 | 88 | 88 | 88 |

Notes
In Tables B1 and B2, the symbols (*1) to (*8) (Additives 1 to 7) are as described above in Examples A1 to A7 and Comparative Examples A1 to A11. The other ingredients are as follows.
(*9) Release agent 1 (Zinc Stearate (trade name), manufactured by NOF CORPORATION)
(*10) Release agent 2 (Aluminum Stearate 300 (trade name), manufactured by NOF CORPORATION)
(*11) Release agent 3 (carnauba wax (Carnauba Wax (trade name), manufactured by TOA KASEI CO., LTD.))
(*12) Release agent 4 (silicone wax (KF910 (trade name), manufactured by Shin-Etsu Chemical Co., Ltd., a polyalkylsiloxane compound having a siloxane main chain)
(*13) Release agent 5 (LICOWAXE (trade name), manufactured by Clariant (Japan) K.K.)
(*14) Release agent 6 (UNITOX 420 (trade name), manufactured by Toyo Petrolite Co., Ltd.)

Tables B1 and B2 show that the thermosetting resin compositions according to the invention (Examples B1 to B14) provide a shear release force of 200 KPa within 10 shots and have good releasability. Particularly, it is apparent that the dispersibility of the release agent is improved in the resin composition containing a compound with a polyorganosiloxane moiety as an additive and containing metallic soap as a release agent (Examples B1 to B14), as compared with the resin composition of each of Comparative Examples B5 to B9 containing the same additive. The resin composition of each of Examples B1 to B14 provides a good affinity between the additive and the release agent and provides a shear release force of 200 KPa from the first shot, therefore the resin composition has high releasability. Actually, the curing product of the resin composition of each of Examples B1 to B14 was destroyed, and the resulting fracture surface was observed with an electron microscope. As a result, no clear interface was observed. On the other hand, the curing product of the resin composition of each of Comparative Examples B5 to B9 was destroyed, and the resulting fracture surface was observed in the same manner. As a result, a clear interface was observed. It is also apparent that when the resin composition of each of Examples B1 to B14 according to the invention is used, molding can be performed 200 times or more continuously, the initial optical reflectance and the optical reflectance after heat treatment can be made high, good optical reflection characteristics can be provided in the near-ultraviolet region, and a high level of thermal discoloration resistance can be provided. It is also apparent that the resin composition of the invention produced with an additive and a release agent is free from a reduction in molten resin fluidity in the mold during transfer molding and maintains moderate fluidity, while it achieves high mold releasability and has dramatically improved moldability.

Examples C1 to C5 and Comparative Examples C1 to C9

1. Preparation of Thermosetting Light-Reflecting Resin Compositions

The raw materials were mixed according to the formulation shown in Tables C1 and C2 below and sufficiently kneaded in a mixer. The mixture was then molten and kneaded under predetermined conditions in a mixing roll, so that a kneaded product was obtained. The resulting kneaded product was then cooled and pulverized, so that each of thermosetting light-reflecting resin compositions of Examples C1 to C5 and Comparative Examples C1 to C9 was prepared. The units of the amounts of raw material given in each table are all parts by weight, and the "-" section means that the corresponding raw material is not added.

2. Evaluation of Thermosetting Light-Reflecting Resin Compositions

Each of the prepared thermosetting light-reflecting resin compositions of Examples C1 to C5 and Comparative Examples C1 to C9 was subjected to each of the characteristic tests. The surface free energy was evaluated according to the procedure described below. The other characteristics were evaluated in the same manner as for the examples and the comparative examples described above. The results are shown in Tables C1 and C2 below.

Surface Free Energy

A 50 mm long, 35 mm wide, 0.4 mm thick, chromium-plated, stainless steel plate was inserted into the shear release force measuring mold described above. The resin composition prepared in each of the examples and the comparative examples was molded on the stainless steel, and immediately after the molding, the stainless steel plate was pulled out. The molding conditions were as follows: a mold temperature of 180° C., a molding pressure of 6.9 MPa and a curing time of 90 seconds.

The pulled-out stainless plate and the molded product released from the mold were then each allowed to stand and cool to 25° C. Thereafter, the contact angle of a droplet on the release surface of each of the stainless steel plate and the molded product was measured at 25° C. by drop method. The liquid samples (droplet samples) used were 1.0 µL of ultra-pure water, 1.0 µL of acetamide, and 1.0 µL of glycerin, whose surface free energies were known.

Part (b) of FIG. 4 is a schematic cross-sectional view illustrating the portion whose surface free energy was measured. In the drawing, reference numeral 420 represents the stainless steel plate, 420a the release surface of the stainless plate to be measured, 430 the molded product, and 430a the release surface of the molded product to be measured. The contact angle on the measurement portion was measured by using a solid-liquid interface analysis system "DROP MASTER 500" (trade name) manufactured by Kyowa Interface Science Co., Ltd. The value obtained by the measurement was subjected to analysis using the acid-base model of the Van Oss method so that the value of the surface free energy was obtained. The values obtained by the measurement after the 10th shot of molding are shown in Tables C1 and C2 below.

TABLE C1

| | | | Examples | | | | |
|---|---|---|---|---|---|---|---|
| | | Items | 1 | 2 | 3 | 4 | 5 |
| Ingredients | Epoxy resin | Trisglycidyl isocyanurate (*1) | 100 | 100 | 100 | 100 | 100 |
| | Curing agent | Hexahydrophthalic anhydride (*2) | 123.4 | 123.4 | 123.4 | 123.4 | 123.4 |
| | | (equivalents based on 1 equivalent of epoxy group | (0.8) | (0.8) | (0.8) | (0.8) | (0.8) |
| | Curing catalyst | Tetra-n-butylphosphonium-o,o-diethylphosphorodithioate (*3) | 3.4 | 3.4 | 3.4 | 3.4 | 3.4 |
| | Coupling agent | Trimethoxy epoxysilane (*4) | 7.0 | 7.0 | 7.0 | 7.0 | 7.0 |
| | Inorganic filler | Spherical fused silica (6 µm in center particle size) (*5) | 796 | 796 | 796 | 796 | 796 |
| | White pigment | Hollow particles (27 µm in center particle size) (*6) | 217 | 217 | 217 | 217 | 217 |
| | | Alumina (1 µm in center particle size) (*7) | 705 | 705 | 705 | 705 | 705 |
| | Additive | Silicone-containing block copolymer (*8) | 10 | 10 | 10 | 10 | 10 |
| | | Core-shell fine particle additive (*9) | | | | | |
| | | Core-shell fine particle additive (*10) | | | | | |
| | | Core-shell fine particle additive (*11) | | | | | |
| | Release agent | Zinc stearate (*12) | 0.5 | 1.0 | | | |
| | | Aluminum stearate (*13) | | | 1.0 | 1.5 | |
| | | Montanoic acid ester wax (*14) | | | | | 1.0 |
| | | Alkyl polyether wax (*15) | | | | | 1.0 |
| | | Carnauba wax (*16) | | | | | |
| | | Silicone wax (*17) | | | | | |
| Characteristics | | Initial optical reflectance (%) | 96 | 97 | 97 | 96 | 97 |
| | | Optical reflectance (%) after 72 h heat treatment | 93 | 92 | 93 | 93 | 90 |
| | | Optical reflectance (%) after 500 h heat treatment | 89 | 89 | 88 | 87 | 80 |
| | | Spiral flow (cm) | 120 | 110 | 120 | 115 | 113 |
| | | Surface free energy (mJ/m$^2$) of molded product surface after mold release | 12.5 | 16.57 | 17 | 16.4 | 16.4 |
| | | Surface free energy (mJ/m$^2$) of mold surface after mold release | 19.5 | 18.4 | 18.4 | 17.9 | 13.5 |
| | | Number of times of molding continuation | >200 | >200 | >200 | >200 | >200 |
| | | Shear release force (10th shot, KPa) | 20 | 20 | 20 | 20 | 20 |
| | | Hot hardness (shore D) | 88 | 87 | 86 | 88 | 89 |

TABLE C2

| | Items | | Comparative Examples | | | | |
|---|---|---|---|---|---|---|---|
| | | | 1 | 2 | 3 | 4 | 5 |
| Ingredients | Epoxy resin | Trisglycidyl isocyanurate (*1) | 100 | 100 | 100 | 100 | 100 |
| | Curing agent | Hexahydrophthalic anhydride (*2) | 123.4 | 123.4 | 123.4 | 123.4 | 123.4 |
| | | (equivalents based on 1 equivalent of epoxy group | (0.8) | (0.8) | (0.8) | (0.8) | (0.8) |
| | Curing catalyst | Tetra-n-butylphosphonium-o,o-diethylphosphorodithioate (*3) | 3.4 | 3.4 | 3.4 | 3.4 | 3.4 |
| | Coupling agent | Trimethoxy epoxysilane (*4) | 7.0 | 7.0 | 7.0 | 7.0 | 7.0 |
| | Inorganic filler | Spherical fused silica (6 μm in center particle size) (*5) | 796 | 796 | 796 | 796 | 796 |
| | White pigment | Hollow particles (27 μm in center particle size) (*6) | 217 | 217 | 217 | 217 | 217 |
| | | Alumina (1 μm in center particle size) (*7) | 705 | 705 | 705 | 705 | 705 |
| | Additive | Silicone-containing block copolymer (*8) | | | | | |
| | | Core-shell fine particle additive (*9) | | | 15 | | |
| | | Core-shell fine particle additive (*10) | | | | 15 | |
| | | Core-shell fine particle additive (*11) | | | | | 15 |
| | Release agent | Zinc stearate (*12) | 1.0 | | 1.0 | 1.0 | 1.0 |
| | | Aluminum stearate (*13) | | 1.0 | | | |
| | | Montanoic acid ester wax (*14) | | | | | |
| | | Alkyl polyether wax (*15) | | | | | |
| | | Carnauba wax (*16) | | | | | |
| | | Silicone wax (*17) | | | | | |
| Characteristics | Initial optical reflectance (%) | | 97 | 97 | 96 | 97 | 97 |
| | Optical reflectance (%) after 72 h heat treatment | | 92 | 93 | 93 | 93 | 93 |
| | Optical reflectance (%) after 500 h heat treatment | | 87 | 86 | 87 | 86 | 87 |
| | Spiral flow (cm) | | 120 | 125 | 130 | 125 | 110 |
| | Surface free energy (mJ/m$^2$) of molded product surface after mold release | | 35.7 | 36.3 | 34.6 | 38.1 | 36.7 |
| | Surface free energy (mJ/m$^2$) of mold surface after mold release | | 32.4 | 43.5 | 49.5 | 47.9 | 48.1 |
| | Number of times of molding continuation | | 0 | 0 | 0 | 0 | 0 |
| | Shear release force (10th shot, KPa) | | 750 | 800 | 780 | 850 | 700 |
| | Hot hardness (shore D) | | 88 | 87 | 89 | 88 | 88 |

| | Items | | Comparative Examples | | | |
|---|---|---|---|---|---|---|
| | | | 6 | 7 | 8 | 9 |
| Ingredients | Epoxy resin | Trisglycidyl isocyanurate (*1) | 100 | 100 | 100 | 100 |
| | Curing agent | Hexahydrophthalic anhydride (*2) | 123.4 | 123.4 | 123.4 | 123.4 |
| | | (equivalents based on 1 equivalent of epoxy group) | (0.8) | (0.8) | (0.8) | (0.8) |
| | Curing catalyst | Tetra-n-butylphosphonium- (*3) o,o-diethylphosphorodithioate | 3.4 | 3.4 | 3.4 | 3.4 |
| | Coupling agent | Trimethoxy epoxysilane (*4) | 7.0 | 7.0 | 7.0 | 7.0 |
| | Inorganic filler | Spherical fused silica (6 μm in center particle size) (*5) | 796 | 796 | 796 | 796 |
| | White pigment | Hollow particles (27 μm in center particle size) (*6) | 217 | 217 | 217 | 217 |
| | | Alumina (1 μm in center particle size) (*7) | 705 | 705 | 705 | 705 |
| | Additive | Silicone-containing block copolymer (*8) | | | | |
| | | Core-shell fine particle additive (*9) | | | | |
| | | Core-shell fine particle additive (*10) | | | | |
| | | Core-shell fine particle additive (*11) | | | | |
| | Release agent | Zinc stearate (*12) | | | | |
| | | Aluminum stearate (*13) | | | | |
| | | Montanoic acid ester wax (*14) | | | | |
| | | Alkyl polyether wax (*15) | | | | |
| | | Carnauba wax (*16) | | | 4.0 | 8.0 |
| | | Silicone wax (*17) | 2.0 | | | |
| Characteristics | Initial optical reflectance (%) | | 86 | 89 | 82 | 94 |
| | Optical reflectance (%) after 72 h heat treatment | | 80 | 84 | 76 | 92 |
| | Optical reflectance (%) after 500 h heat treatment | | 75 | 73 | 78 | 82 |
| | Spiral flow (cm) | | 107 | 115 | 118 | 121 |
| | Surface free energy (mJ/m$^2$) of molded product surface after mold release | | 48 | 46.5 | 47.9 | 44 |
| | Surface free energy (mJ/m$^2$) of mold surface after mold release | | 50.2 | 48.3 | 46.3 | 49.3 |
| | Number of times of molding continuation | | 0 | 0 | 0 | 0 |
| | Shear release force (10th shot, KPa) | | 800 | 500 | 400 | 900 |
| | Hot hardness (shore D) | | 88 | 88 | 88 | 88 |

Notes

In Tables C1 and C2, the symbols (*1) to (*17) represent as follows.

(*1) Triglycidyl isocyanurate (TEPIC-S (trade name), manufactured by NISSAN CHEMICAL INDUSTRIES, LTD., 100 in epoxy equivalent)

(*2) Hexahydrophthalic anhydride (manufactured by Wako Pure Chemical Industries, Ltd.)

(*3) PX-4ET (trade name), manufactured by Nippon Chemical Industrial Co., Ltd.

(*4) Trimethoxyepoxysilane (A-187 (trade name), manufactured by Dow Corning Toray Co., Ltd.)

(*5) Fused silica (FB-30I (trade name), manufactured by DENKI KAGAKU KOGYO KABUSHIKI KAISHA)

(*6) Hollow particles (S60-HS (trade name), manufactured by Sumitomo 3M Limited)

(*7) Alumina (AO-25R (trade name), manufactured by Admatechs)

(*8) Silicone-containing block copolymer (Product No. SLJ-1661-02 developed by WACKER ASAHIKASEI SILICONE CO., LTD.) The details of this compound are as follows.

TABLE C2-continued

Structural unit components (% by weight): polycaprolactone unit ($M_{PCL}$)/polydimethylsiloxane unit ($M_{PDM}$) = 50/50
Unit number ratio (m/n): 0.69. In the ratio m/n, m corresponds to the sum of $m_1$ and $m_2$ of formula (4) above.
Number average molecular weight (Mn): 6179
Dispersity (Mw/Mn): 1.5. The Mn and Mw were based on values measured by GPC using a pump (Model L-6200, manufactured by Hitachi, Ltd.), columns (TSKgel-G5000HXL and TSKgel-G2000HXL (trade names), all manufactured by TOSOH CORPORATION), a detector (Model L-3300RI, manufactured by Hitachi, Ltd.), and tetrahydrofuran as an eluent under the conditions of a temperature of 30° C. and a flow rate of 1.0 ml/minute.
(*9) Core-shell fine particle additive (S2001 (trade name) manufactured by Mitsubishi Rayon Co., Ltd.). This additive is a compound composed of a core of an acrylonitrile-styrene-dimethylsiloxane-alkyl acrylate copolymer and a shell of poly(methyl methacrylate) and has an average diameter of 0.3 μm.
(*10) Core-shell fine particle additive (KS5535 (trade name) manufactured by Mitsubishi Rayon Co., Ltd.). This additive is a compound composed of a core of acrylic rubber and a shell of poly(methyl methacrylate) and has an average particle size of 0.3 μm.
(*11) Core-shell fine particle additive (SRK200 (trade name) manufactured by Mitsubishi Rayon Co., Ltd.). This additive is a compound composed of a core of an acrylonitrile-styrene-dimethylsiloxane-alkyl acrylate copolymer and a shell of acrylonitrile and has an average particle size of 0.3 μm.
(*12) Zinc Stearate (trade name) manufactured by NOF CORPORATION
(*13) Aluminum Stearate 300 (trade name) manufactured by NOF CORPORATION
(*14) Montanoic acid ester wax (LICOWAXE (trade name), manufactured by Clariant (Japan) K.K.)
(*15) Alkyl polyether wax (UNITOX 420 (trade name), manufactured by Toyo Petrolite Co., Ltd.)
(*16) carnauba wax (Carnauba Wax (trade name), manufactured by TOA KASEI CO., LTD.))
(*17) silicone wax (KF910 (trade name), manufactured by Shin-Etsu Chemical Co., Ltd., a polyalkylsiloxane compound having a siloxane main chain)

Tables C1 and C2 show that when the thermosetting light-reflecting resin composition of the invention is transfer-molded, all the release surfaces of the molded product and the mold can have a surface free energy of 30 mJ/m² or less, the molding can be performed 100 times or more continuously, and good releasability can be achieved. It is apparent that according to the invention, the specific compound having a polyorganosiloxane moiety is effective in improving the releasability, when used as an additive. Actually, the curing product of the resin composition of each of Examples C1 to C5 was destroyed, and the resulting fracture surface was observed with an electron microscope. As a result, no clear interface was observed. On the other hand, the curing product of the resin composition of each of Comparative Examples C1 to C9 was destroyed, and the resulting fracture surface was observed in the same manner. As a result, a clear interface was observed. These indicate that the compounds used as additives increase the dispersibility of the release agent. In addition, the resin composition of each of Examples C1 to C5 according to the invention not only has high moldability but also provides a high initial optical reflectance and a high post-heat-treatment optical reflectance. The resin composition of each of Examples C1 to C5 according to the invention also provides good optical reflection characteristics in the near-ultraviolet region and a high level of thermal discoloration resistance.

It is also apparent that the resin composition of the invention produced with a specific additive and a release agent is free from a reduction in molten resin fluidity in the mold during transfer molding and maintains moderate fluidity, while it achieves high mold releasability and has dramatically improved moldability. Using such a resin composition makes it possible to reduce the amount and frequency of use of an external release agent in the molding process, so that it can increase the productivity of transfer molding to form boards.

As evident from the above description, a wide variety of embodiments may be made without departing from the spirit and scope of the invention, and the invention is not limited to the embodiments shown, but is to be accorded the widest scope consistent with the claims.

The invention claimed is:

1. A thermosetting light-reflecting resin composition, comprising (A) an epoxy resin, (B) a curing agent, (C) a curing catalyst, (D) an inorganic filler, (E) a white pigment, (F) an additive, and (G) a release agent, wherein:
    the white pigment (E) is a combination of inorganic hollow particles and at least one selected from the group consisting of alumina, magnesium oxide, antimony oxide, titanium oxide, and zirconium oxide;
    the additive (F) includes a triblock copolymer which is a compound represented by formula (III):

$$HO + R^1 - \overset{O}{\underset{\|}{C}} - O \biggr)_{m_1} R^4 \left( \underset{R^3}{\overset{R^2}{\underset{|}{\overset{|}{Si}}}} - O \right)_l \underset{R^3}{\overset{R^2}{\underset{|}{\overset{|}{Si}}}} - R^4 \left( O - \overset{O}{\underset{\|}{C}} - R^1 \right)_{m_2} OH \quad (III)$$

wherein
    l is an integer of 1 to 200,
    $m_1 + m_2$ is an integer of 2 to 400,
    $R^1$ is selected from the group consisting of an alkylene group having 1 to 10 carbon atoms,
    $R^2$ and $R^3$ are independently selected from the group consisting of: a monovalent organic group having 1 to 10 carbon atoms including at least one of an alkyl group, an aryl group, an alkoxy group, and an epoxy group; a monovalent organic group having 1 to 10 carbon atoms including a carboxyl group; and a polyalkylene ether group having 3 to 500 carbon atoms, and
    $R^4$ is selected from the group consisting of a divalent hydrocarbon group having 1 to 10 carbon atoms;
    the release agent (G) comprises a metallic soap having a structure represented by formula (1-1):

$$(R_0-COO)qM_1 \quad (1\text{-}1)$$

wherein $R_0$ is a substituent selected from the group consisting of: a monovalent organic group having 3 to 50 carbon atoms including at least one of an alkyl group, an aryl group, an alkoxy group, and an epoxy group; a monovalent organic group having 3 to 50 carbon atoms including a carboxyl group; and a polyalkylene ether group having 3 to 500 carbon atoms,
    $M_1$ is a metal element selected from the group consisting of: third period elements; Group IIA alkaline earth metal elements; and metal elements belonging to Groups IVB, IIB, VIII, IB, IIIA, IIIB, and IVA; and
    q is an integer of 1 to 4; and
    the resin composition, after curing, has a diffuse reflectance of at least 80% at a light wavelength of 400 nm; and the resin composition is possible to perform transfer molding at least 100 times continuously.

2. The thermosetting light-reflecting resin composition of claim 1, wherein the resin composition provides a shear release force of at most 200 KPa within 10 shots of the transfer molding.

3. The thermosetting light-reflecting resin composition of claim 1, wherein the resin composition provides a shear release force of at most 200 KPa at the first shot of the transfer molding.

4. The thermosetting light-reflecting resin composition of claim 1, wherein a surface free energy at a surface of a product obtained after releasing from a mold is at most 30 mJ/m2, when the product is formed by performing transfer molding of the resin composition and then releasing from the mold.

5. The thermosetting light-reflecting resin composition of claim 4, wherein after releasing from the mold, a surface free energy at a surface of the mold is at most 30 mJ/m2.

6. The thermosetting light-reflecting resin composition of claim 1, wherein a curing product of the resin composition has a diffuse reflectance of at least 80% at a light wavelength of 400 nm, when it is measured after the curing product is allowed to stand under a high temperature condition at 150° C. for at least 72 hours.

7. The thermosetting light-reflecting resin composition of claim 1, wherein the triblock copolymer has a number average molecular weight Mn of 2,000 to 20,000.

8. The thermosetting light-reflecting resin composition of claim 1, wherein the triblock copolymer has a dispersity (Mw/Mn) of 1 to 3.

9. The thermosetting light-reflecting resin composition of claim 1, wherein in formula (1-1), $M_1$ is a metal element selected from the group consisting of magnesium, calcium, barium, aluminum, tin, titanium, iron, cobalt, nickel, copper, and zinc.

10. The thermosetting light-reflecting resin composition of claim 1, wherein in formula (1-1), $R_0$ is selected from the group consisting of an alkyl group having 10 to 50 carbon atoms.

11. The thermosetting light-reflecting resin composition of claim 1, wherein the metallic soap is zinc stearate or aluminum stearate.

12. The thermosetting light-reflecting resin composition of claim 1, wherein at least one of the release agent (G) and the additive (F) is premixed with part or all of the epoxy resin (A).

13. The thermosetting light-reflecting resin composition of claim 1, wherein the inorganic filler (D) is at least one selected from the group consisting of silica, aluminum hydroxide, magnesium hydroxide, barium sulfate, magnesium carbonate, and barium carbonate.

14. The thermosetting light-reflecting resin composition of claim 1, wherein the white pigment (E) has a center particle size of 0.1 to 50 μm.

15. The thermosetting light-reflecting resin composition of claim 1, wherein a total content of the inorganic filler (D) and the white pigment (E) is 10% by volume to 85% by volume, based on the total amount of the resin composition.

16. An optical semiconductor element mounting board, comprising at least one recessed portion that forms an optical semiconductor element mounting region, wherein at least an inner circumference side of the recessed portion is made from the thermosetting light-reflecting resin composition of claim 1.

17. A method for manufacturing an optical semiconductor element mounting board having at least one recessed portion that forms an optical semiconductor element mounting region, comprising molding the thermosetting light-reflecting resin composition of claim 1 to form at least an inner circumference side of the recessed portion.

18. An optical semiconductor device, comprising: the optical semiconductor element mounting board of claim 16; an optical semiconductor element mounted on a bottom of the recessed portion of the board; and a fluorescent substance-containing transparent encapsulant resin layer that is formed in the recessed portion so that the optical semiconductor element is covered with it.

19. The thermosetting light-reflecting resin composition of claim 1, wherein said additive (F) is a dispersing agent emulsifying and dispersing the release agent (G).

20. The thermosetting light-reflecting resin composition of claim 1, which includes 1 to 50 parts by weight of said compound represented by the formula (III) based on 100 parts by weight of said epoxy resin (A).

21. The thermosetting light-reflecting resin composition of claim 1, wherein the metallic soap has a melting point of 100° C. to less than 200° C.

22. The thermosetting light-reflecting resin composition of claim 1, which includes the release agent (G) in an amount of 0.01 to 8 parts by weight based on 100 parts by weight of the epoxy resin (A).

23. A thermosetting light-reflecting resin composition, comprising (A) an epoxy resin, (B) a curing agent, (C) a curing catalyst, (D) an inorganic filler, (E) a white pigment, (F) an additive, and (G) a release agent, wherein:
the white pigment (E) is a combination of inorganic hollow particles and at least one selected from the group consisting of alumina, magnesium oxide, antimony oxide, titanium oxide, and zirconium oxide;
the additive (F) includes a triblock copolymer which is a compound represented by formula (III):

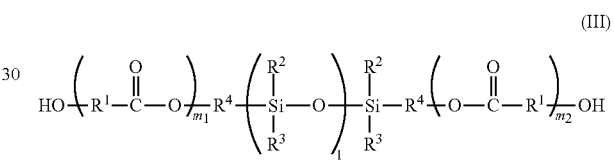

wherein
l is an integer of 1 to 200,
$m_1+m_2$ is an integer of 2 to 400,
$R^1$ is selected from the group consisting of an alkylene group having 1 to 10 carbon atoms,
$R^2$ and $R^3$ are independently selected from the group consisting of: a monovalent organic group having 1 to 10 carbon atoms including at least one of an alkyl group, an aryl group, an alkoxy group, and an epoxy group; a monovalent organic group having 1 to 10 carbon atoms including a carboxyl group; and a polyalkylene ether group having 3 to 500 carbon atoms, and
$R^4$ is selected from the group consisting of a divalent hydrocarbon group having 1 to 10 carbon atoms;
the release agent (G) comprises a metallic soap which is a metal salt of a fatty acid selected from the group consisting of lauric acid, myristic acid, palmitic acid, stearic acid and montanoic acid; and
the resin composition, after curing, has a diffuse reflectance of at least 80% at a light wavelength of 400 nm; and the resin composition is possible to perform transfer molding at least 100 times continuously.

24. A thermosetting light-reflecting resin composition, comprising (A) an epoxy resin, (B) a curing agent, (C) a curing catalyst, (D) an inorganic filler, (E) a white pigment, (F) an additive, and (G) a release agent, wherein:
the white pigment (E) is a combination of inorganic hollow particles and at least one selected from the group consisting of alumina, magnesium oxide, antimony oxide, titanium oxide, and zirconium oxide;
the additive (F) includes a triblock copolymer which is a compound represented by formula (III):

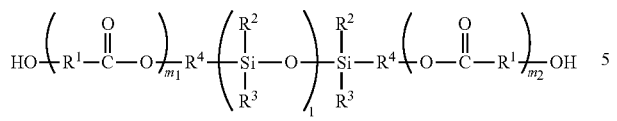

(III)

wherein
l is an integer of 1 to 200,
$m_1+m_2$ is an integer of 2 to 400,
$R^1$ is selected from the group consisting of an alkylene group having 1 to 10 carbon atoms,
$R^2$ and $R^3$ are independently selected from the group consisting of: a monovalent organic group having 1 to 10 carbon atoms including at least one of an alkyl group, an aryl group, an alkoxy group, and an epoxy group; a monovalent organic group having 1 to 10 carbon atoms including a carboxyl group; and a polyalkylene ether group having 3 to 500 carbon atoms, and
$R^4$ is selected from the group consisting of a divalent hydrocarbon group having 1 to 10 carbon atoms;
the release agent (G) comprises at least one compound selected from the group consisting of an aliphatic carboxylic acid, an aliphatic carboxylic acid ester, an aliphatic polyester, a non-oxidized polyolefin, and an oxidized polyolefin having a carboxyl group; and
the resin composition, after curing, has a diffuse reflectance of at least 80% at a light wavelength of 400 nm; and the resin composition is possible to perform transfer molding at least 100 times continuously.

\* \* \* \* \*